(12) United States Patent
Peng et al.

(10) Patent No.: US 12,525,546 B2
(45) Date of Patent: Jan. 13, 2026

(54) METHOD OF FORMING MARK ON SEMICONDUCTOR DEVICE

(71) Applicant: TAIWAN SEMICONDUCTOR MANUFACTURING COMPANY LTD., Hsinchu (TW)

(72) Inventors: Liang-Shiuan Peng, Taipei (TW); Chih-Hung Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 373 days.

(21) Appl. No.: 18/346,840

(22) Filed: Jul. 4, 2023

(65) Prior Publication Data

US 2025/0015011 A1    Jan. 9, 2025

(51) Int. Cl.
| | |
|---|---|
| *H01L 23/544* | (2006.01) |
| *H01L 21/311* | (2006.01) |
| *H01L 21/3213* | (2006.01) |
| *H01L 21/768* | (2006.01) |

(52) U.S. Cl.
CPC ...... *H01L 23/544* (2013.01); *H01L 21/31105* (2013.01); *H01L 21/32131* (2013.01); *H01L 21/76801* (2013.01); *H01L 21/76838* (2013.01); *H01L 2223/54433* (2013.01)

(58) Field of Classification Search
CPC ......... H01L 23/544; H01L 2223/54433; H01L 2223/5442; H01L 2223/54426; H01L 2223/54453; H01L 21/31105; H01L 21/32131; H01L 21/76801
See application file for complete search history.

(56) References Cited

U.S. PATENT DOCUMENTS

| | | | |
|---|---|---|---|
| 2005/0282396 A1* | 12/2005 | Lin | H01L 23/544 257/E23.179 |
| 2021/0013396 A1* | 1/2021 | Wang | H10B 61/00 |
| 2021/0098409 A1* | 4/2021 | Chen | H01L 23/544 |
| 2021/0167282 A1* | 6/2021 | Wang | H01L 23/544 |
| 2023/0107492 A1* | 4/2023 | Song | H01L 23/544 257/797 |
| 2023/0245977 A1* | 8/2023 | Wang | H10F 39/014 257/414 |
| 2023/0326871 A1* | 10/2023 | Kang | H01L 23/49833 |
| 2024/0019486 A1* | 1/2024 | Wu | H01L 21/6835 |
| 2024/0120291 A1* | 4/2024 | Kim | H01L 23/3121 |

* cited by examiner

*Primary Examiner* — Alexander G Ghyka
(74) *Attorney, Agent, or Firm* — WPAT LAW; Anthony King

(57) ABSTRACT

The present disclosure provides a method for manufacturing a semiconductor device having a mark. The method includes: providing a substrate including a device region and a peripheral region adjacent to the device region; forming an interconnect layer over the substrate; depositing a first dielectric layer on the interconnect layer; forming a redistribution layer (RDL) over the first dielectric layer in the device region; depositing a second dielectric layer on the RDL in the device region and the first dielectric layer in the device region and the peripheral region; and removing portions of the second dielectric layer, the first dielectric layer and the interconnect structure in the peripheral region to form the mark in the peripheral region.

20 Claims, 30 Drawing Sheets

METHOD OF FORMING MARK ON SEMICONDUCTOR DEVICE

BACKGROUND

In a fab, each wafer needs to have its identity number for fab members to check its manufacturing process. Therefore, a mark including a unique identity number needs to be formed on a wafer. Normally, the mark is formed near a notch of a wafer. Laser is an excellent tool to form marks due its precision, high speed and low damages. Laser marks are machine readable and do not limit any other processes that are performed on a wafer.

In the back-end-of-line (BEOL) stage of processing a wafer, different metals may be used to form interconnect layers or redistribution layers (RDLs). When different metals are used to form a topmost layer of the wafer, the difficulty of forming laser marks with the same power of laser may be varied. Sometimes the laser mark may be unreadable if a heavy metal or a dense metal is used to form the topmost layer. Therefore, there is a need to improve the laser marking process.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

DETAILED DESCRIPTION

Figure 1:
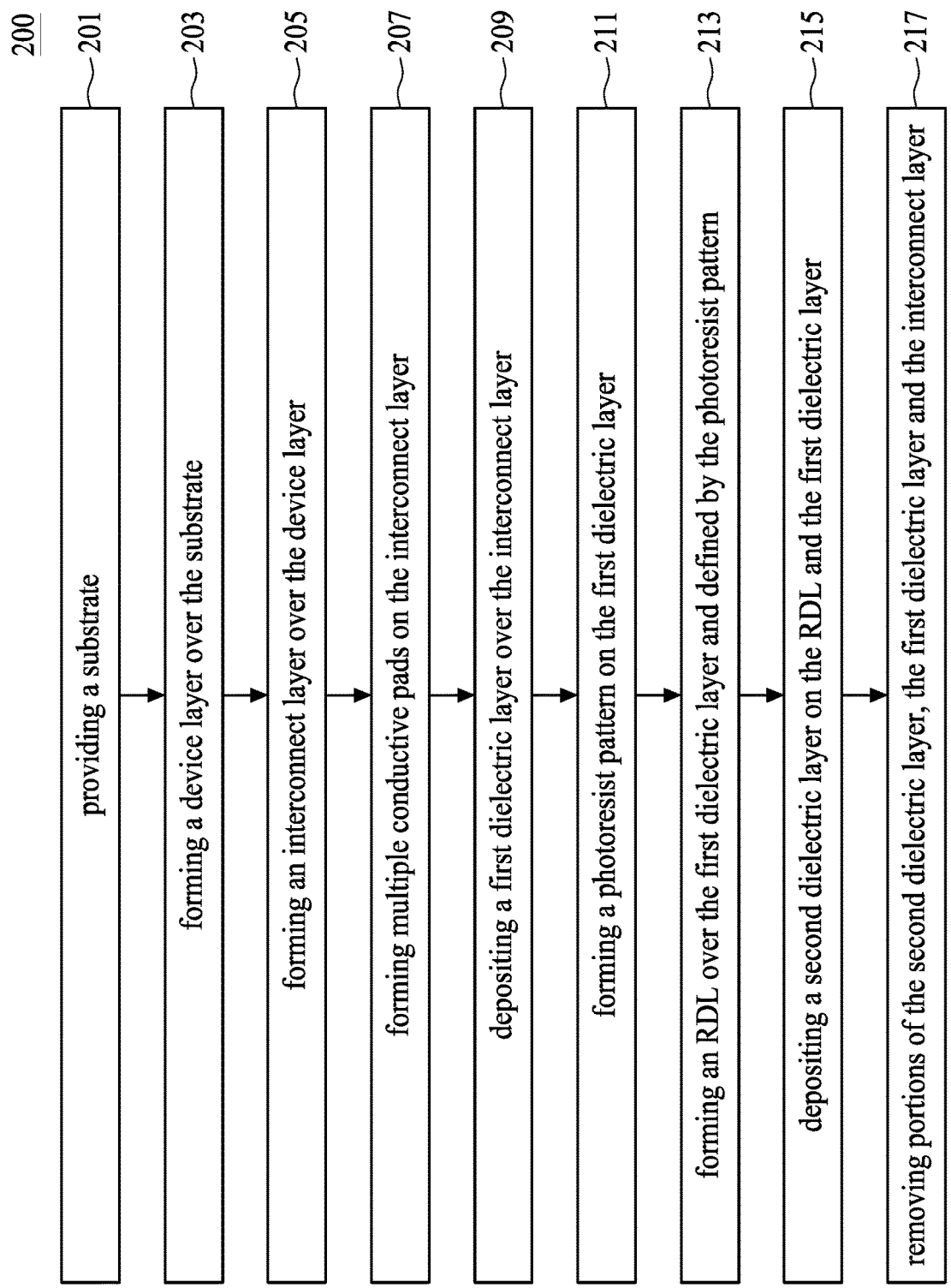
FIG. 1 is a flow diagram showing a method of forming a mark on a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a flow diagram showing a method 200 of forming a mark on a semiconductor device. FIGS. 2 to 15 are schematic cross-sectional and top views illustrating sequential operations of the method 200 shown in FIG. 1. The method 200 includes a number of operations (201, 203, 205, 207, 209, 211, 213, 215 and 217) and the description and illustration are not deemed as a limitation to the sequence of the operations.

Figure 2:
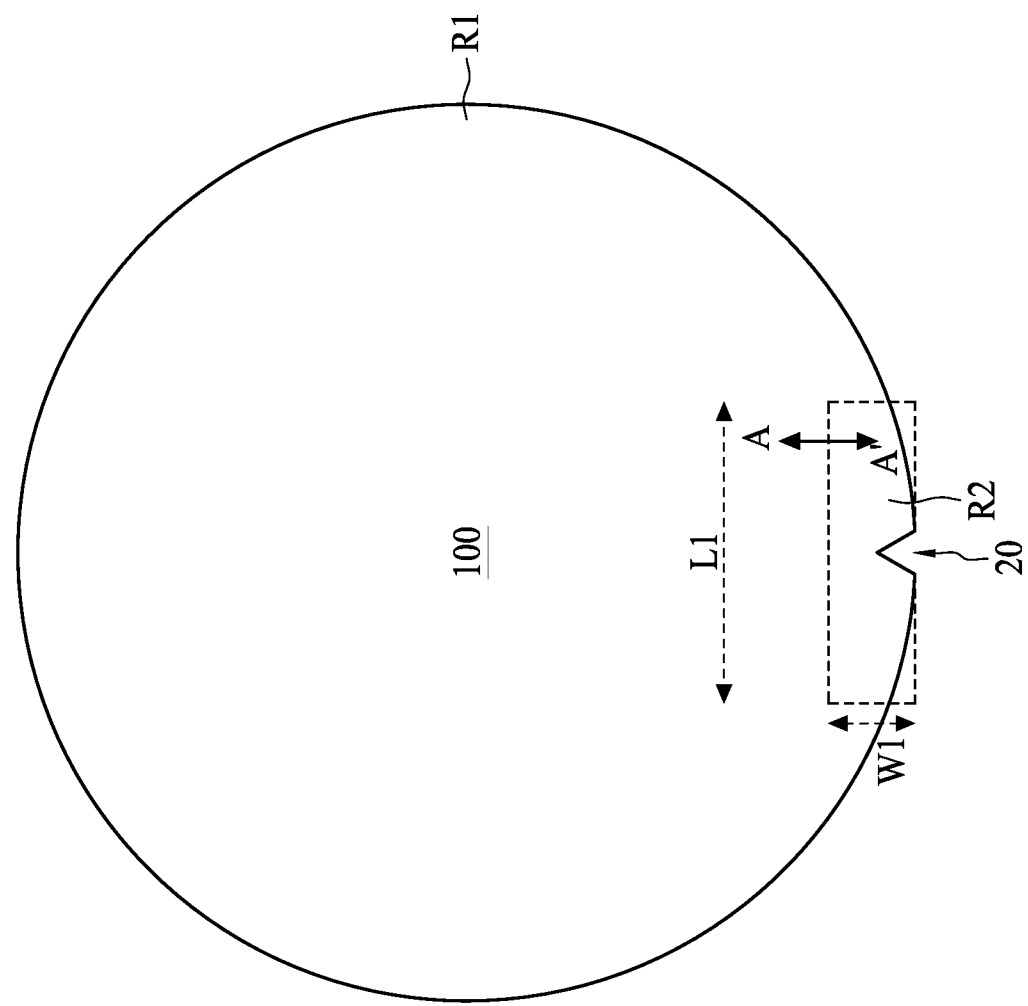
FIGS. 2 to 14 are schematic top and cross-sectional views illustrating sequential operations of the method shown in FIG. 1, in accordance with some embodiments of the present disclosure.
Figure 3:
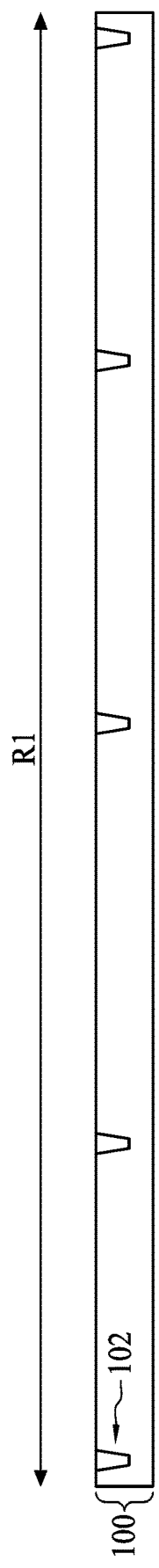

In operation 201 of FIG. 1, a substrate 100 is provided, as shown in FIGS. 2 and 3. FIG. 2 is a schematic top view of the substrate 100. The substrate 100 may be a semiconductor substrate such as a bulk silicon wafer. In some embodiments, the substrate 100 is a semiconductor-on-insulator (SOI) substrate, a multi-layered or a gradient substrate, or the like. The substrate 100 may include a semiconductor material such as Si; Ge; a compound or alloy semiconductor including SiC, SiGe, GaAs, GaP, GaAsP, AlInAs, AlGaAs, GaInAs, InAs, GaInP, InP, InSb or GaInAsP; or a combination thereof. The substrate 100 includes a device region R1 and a peripheral region R2 adjacent to the device region R1. In some embodiments, the peripheral region R2 has a width W1 between about 7 millimeters (mm) and about 10 mm and a length L1 between about 60 mm and about 65 mm. The device region R1 is substantially greater than the peripheral region R2. In some embodiments, the substrate 100 has a notch 20 in the peripheral region R2.

FIG. 3 shows a schematic cross-sectional view of the device region R1 of the substrate 100. In some embodiments, the substrate 100 includes multiple isolation structures 102. The isolation structures 102 may be shallow trench isolations (STIs). Although not specifically illustrated, the isolation structures 102 may be trenches filled with an insulating material. Appropriate wells (not shown) may be formed in the substrate 100 and separated by the isolation structures 102. In some embodiments, a P-well is formed in the substrate 100 where an N-type device, such as an N-type FET, is to be formed. In some embodiments, an N-well is formed in the substrate 100 where a P-type device, such as a P-type FET, is to be formed. In some embodiments, both a P-well and an N-well are formed in the substrate 100. The wells may be formed using an ion-implantation operation. P-type dopants such as boron (B), gallium (Ga) and indium (In), or N-type dopants such as phosphorous (P) and arsenide (As), may be implanted into selected regions of the substrate 100 using an implant mask.

Figure 4:
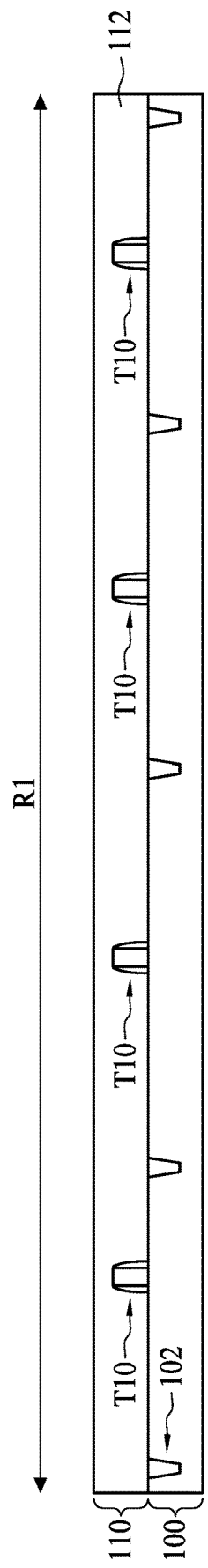

In operation 203 of FIG. 1, a device layer 110 is formed over the substrate 100, as shown in FIG. 4. The device layer 110 may include multiple transistors T10 surrounded by a dielectric layer 112. Although not specifically illustrated, the transistors T10 may be formed using a series of lithographic, etch, deposition, implantation, epitaxial growth, planarization operations or the like. The transistors T10 may be separated by the isolation structures 102. Each transistor T10 includes a gate structure and its corresponding source/drain structures. The dielectric layer 112 may include silicon oxide, silicon nitride, undoped silicate glass (USG), phospho-silicate glass (PSG), boro-silicate glass (BSG), boron-doped phospho-silicate glass (BPSG), tetraethyl orthosilicate (TEOS), or other suitable materials. In some embodiments, the dielectric material of the ILD layer or IMD layer may include an extreme low-k (ELK) dielectric, which has a dielectric constant between 2.0 and 3.0. Multiple conductive contacts (not shown) may be respectively formed on the gate structure and the source/drain structures of each transistor T10. The conductive contacts may provide electrical connection between the transistors T10 and layers that are subsequently formed over the transistors T10.

Figure 5:
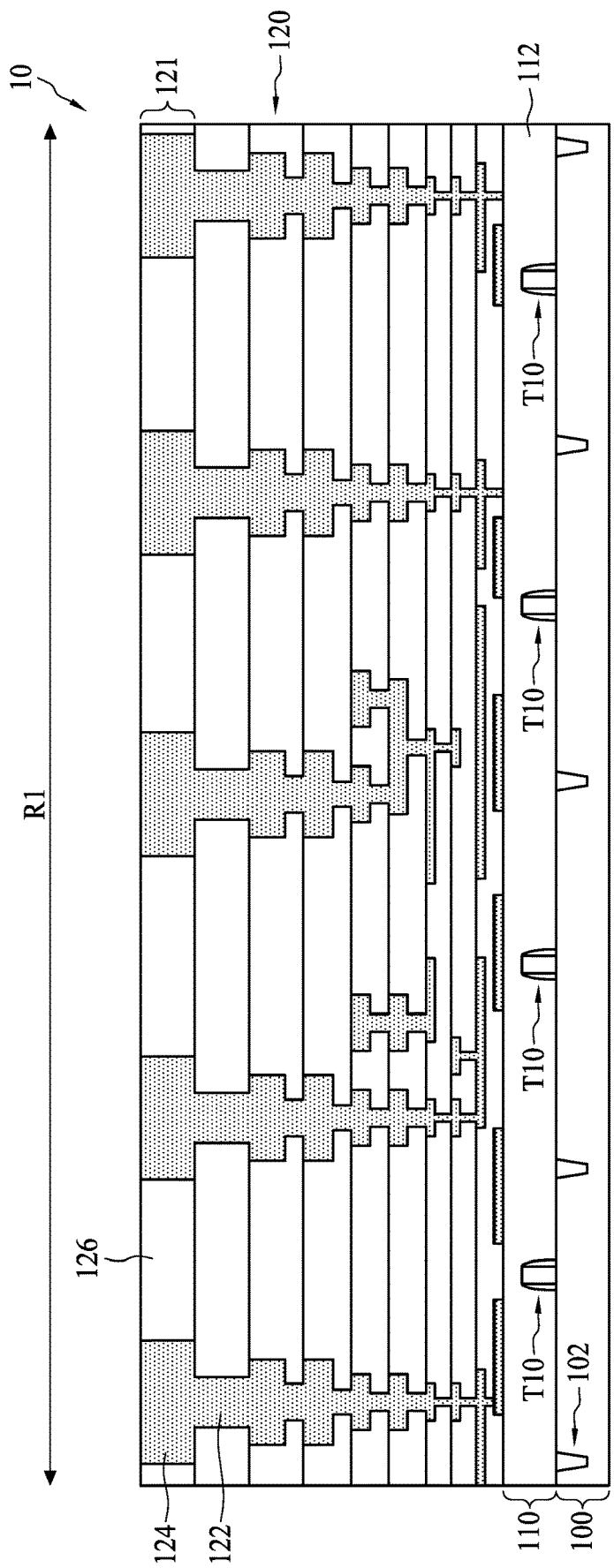

In operation 205 of FIG. 1, an interconnect layer 120 is formed over the device layer 110, as shown in FIG. 5. The interconnect layer 120 may include multiple stacked layers, each of which includes multiple conductive features such as conductive vias 122 or conductive lines 124. The conductive vias 122 in one layer are aligned with and connected to the conductive lines 124 in an adjacent layer. The conductive vias 122 and conductive lines 124 may be surrounded by an inter-layer dielectric (ILD) layer 126 or an inter-metal dielectric (IMD) layer 126 over the device layer 110. Although not specifically illustrated, the conductive vias 122, the conductive lines 124 and the ILD layer 126 are formed in a BEOL stage during the formation of a semiconductor device. The interconnect layer 120 may be formed using a series of lithographic, etch, deposition, planarization operations or the like. The ILD layer 126 may include a similar material to the dielectric layer 112. The conductive vias 122 and the conductive lines 124 may be formed using a single-damascene method or a dual-damascene method. The conductive vias 122 and the conductive lines 124 may be electrically coupled to the transistors T10. The highest layer of the interconnect layer 120 including the conductive lines 124 may be referred to as a top metal layer 121.

Figure 6:
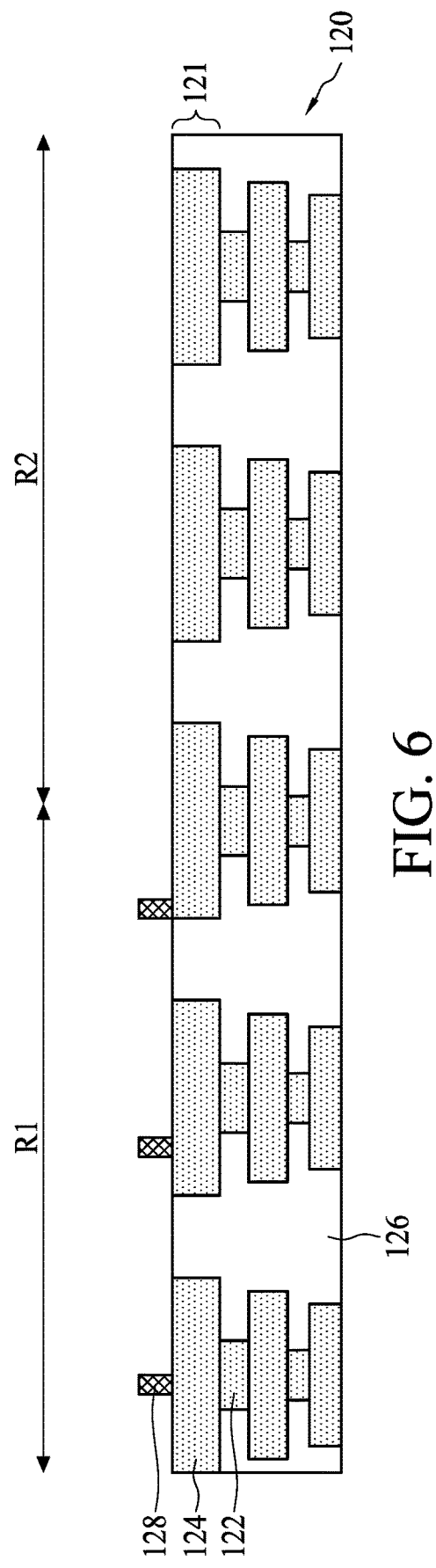

FIG. 6 is a partial schematic cross-sectional view showing the top metal layer 121 in FIG. 5 and taken along the A-A' line in FIG. 2. In operation 207 of FIG. 1, multiple conductive members 128 are formed on the interconnect layer 120, as shown in FIG. 6. The conductive members 128 are respectively formed on the conductive lines 124 of the top metal layer 121 in the device region R1. The conductive members 128 may be electrically coupled to the conductive lines 124, respectively.

Figure 7:
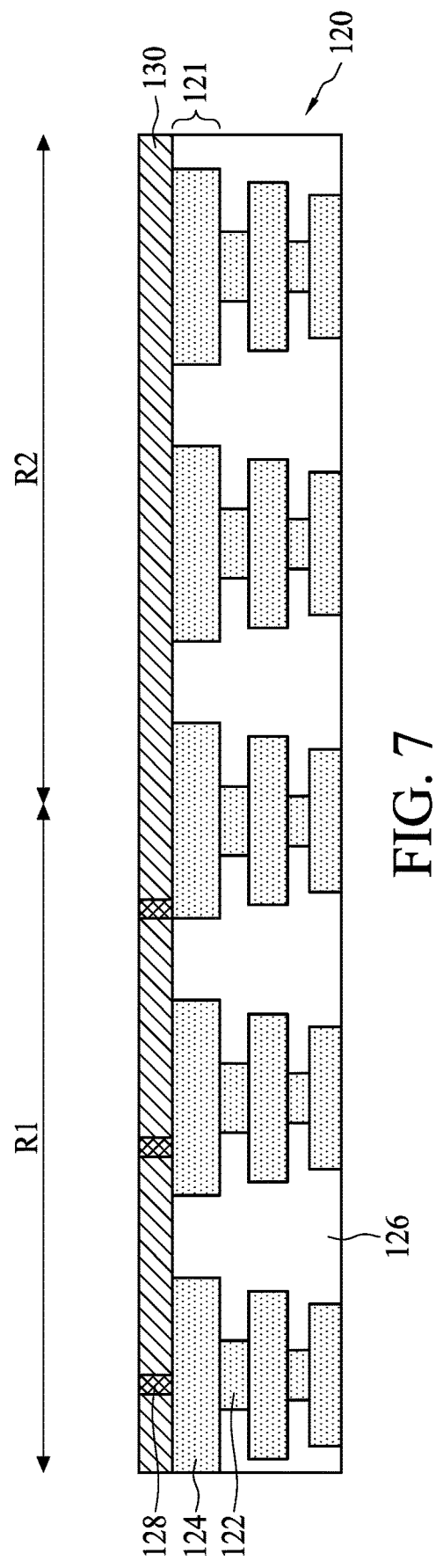

In operation 209 of FIG. 1, a first dielectric layer 130 is deposited over the interconnect layer 120, as shown in FIG. 7. In some embodiments, the first dielectric layer 130 includes silicon nitride. A chemical vapor deposition (CVD) operation or an atomic layer deposition (ALD) operation may be used to deposit silicon nitride over the interconnect layer 120 and conformally along sidewalls of the conductive members 128. A planarization operation such as chemical mechanical polishing (CMP) may be used to remove excess silicon nitride over top surfaces of the conductive members 128, thereby forming the first dielectric layer 130. In some embodiments, the first dielectric layer 130 has a thickness between about 9000 Å and about 15000 Å. The conductive members 128 may be surrounded by the first dielectric layer 130.

Figure 8:
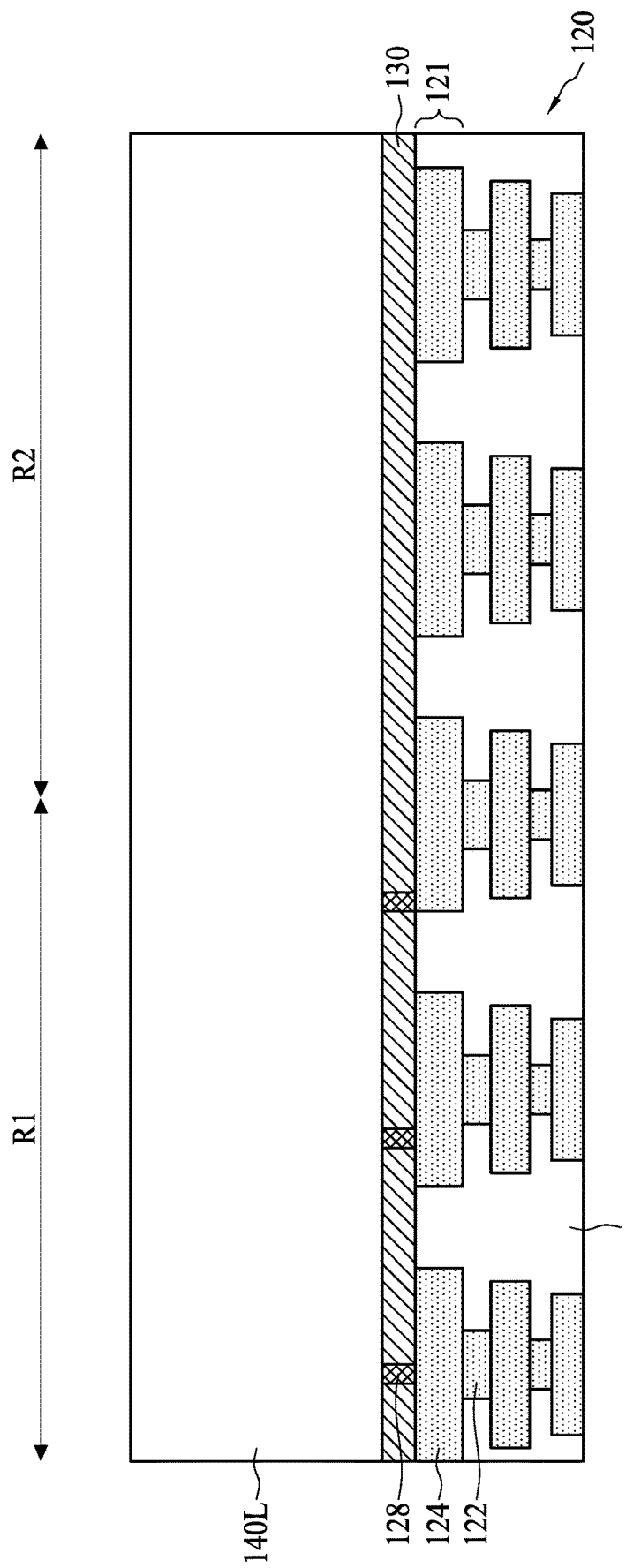
Figure 9:
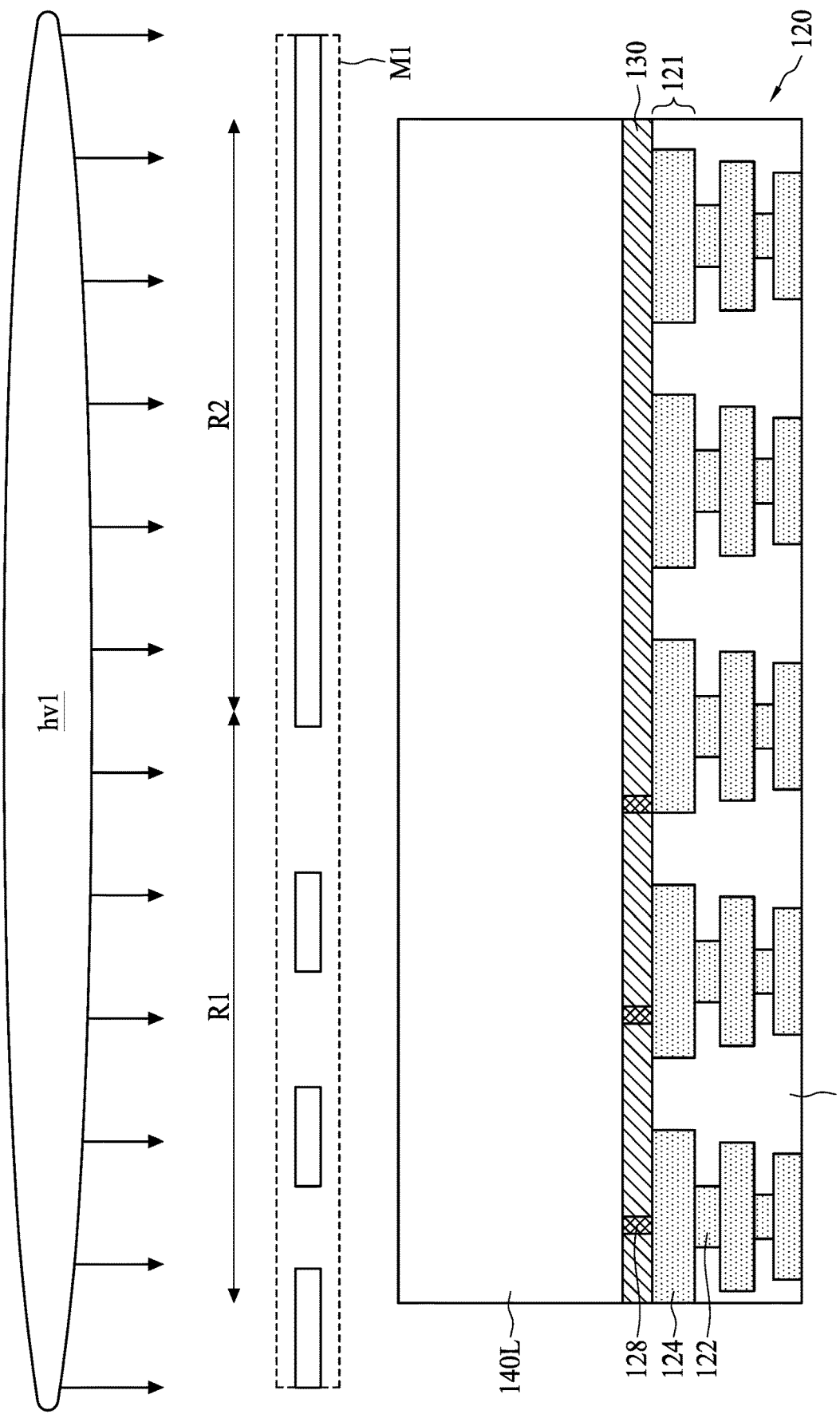
Figure 10:
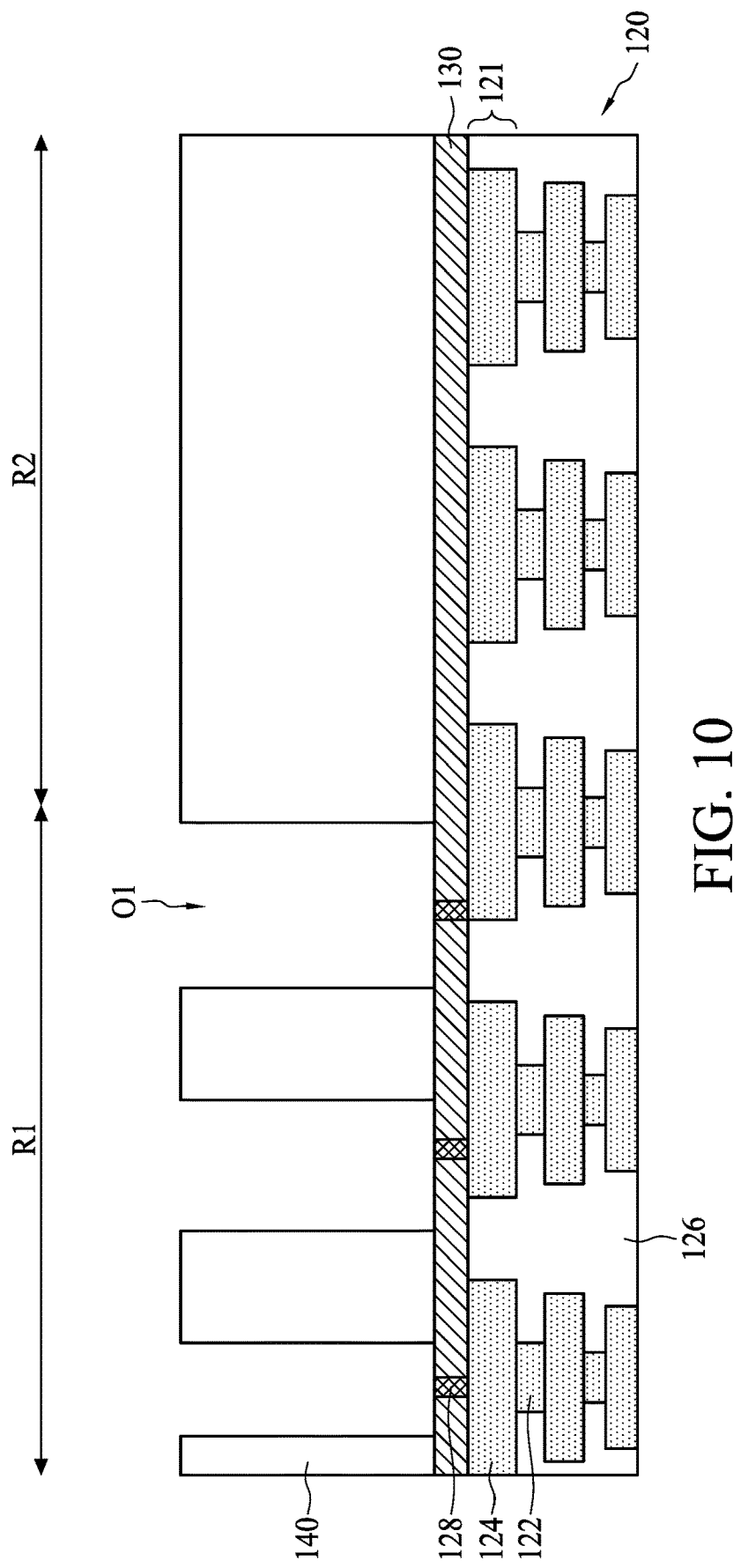

In operation 211 of FIG. 1, a photoresist pattern 140 is formed on the first dielectric layer 130, as shown in FIGS. 8 to 10. Referring to FIG. 8, a photoresist layer 140L is coated on the first dielectric layer 130 and the conductive members 128.

Referring to FIG. 9, the photoresist layer 140L is exposed to a radiation hv1 such as deep ultraviolet (DUV) or extreme ultraviolet (EUV) through a photomask M1. In some embodiments, only portions of the photoresist layer 140L in the device region R1 are exposed to the radiation hv1 when the photomask M1 is used.

Referring to FIG. 10, the exposed photoresist layer 140L is developed, and the photoresist pattern 140 is thereby formed. The photoresist pattern 140 may have a thickness between about 20000 Å and about 60000 Å. In some embodiments, the photoresist pattern 140 includes multiple openings O1 that expose the conductive members 128 and portions of the first dielectric layer 130 in the device region R1. In some embodiments, the photoresist pattern 140 partially covers the first dielectric layer 130 in the device region R1 and completely covers the first dielectric layer 130 in the peripheral region R2.

Figure 11:
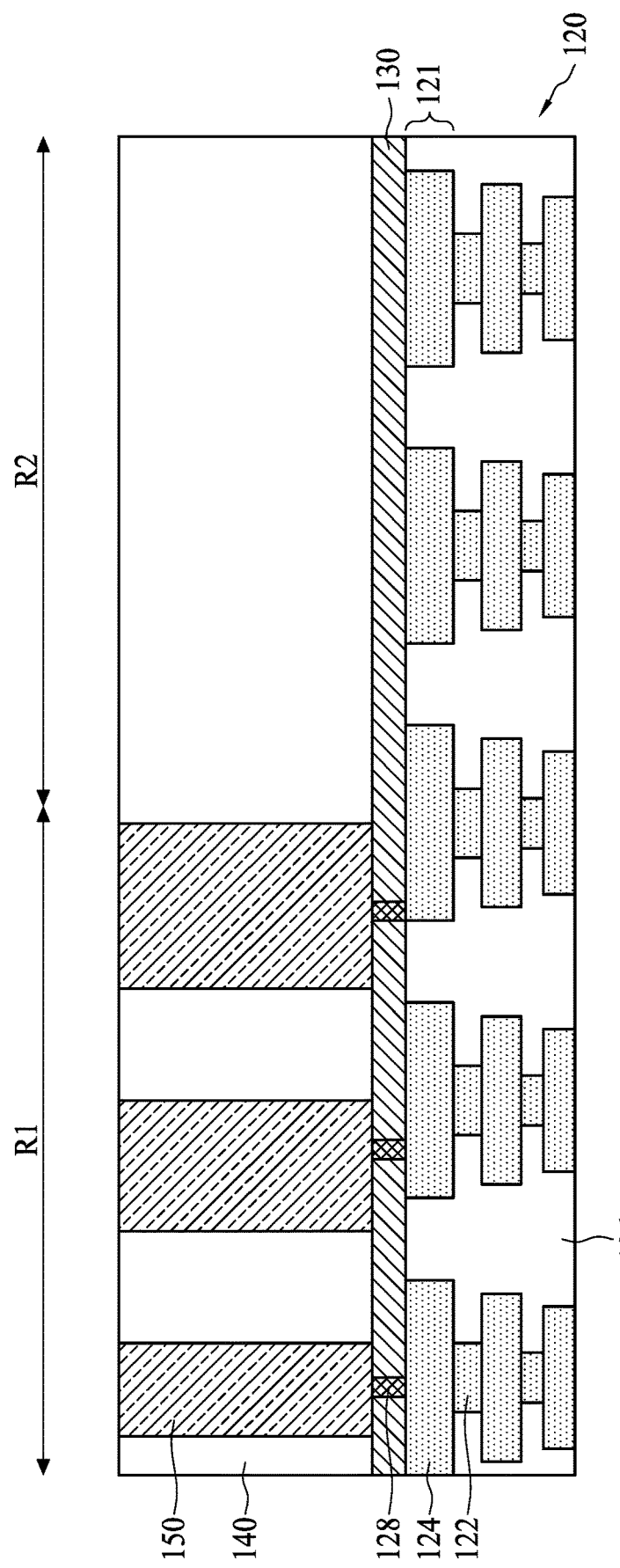
Figure 12:
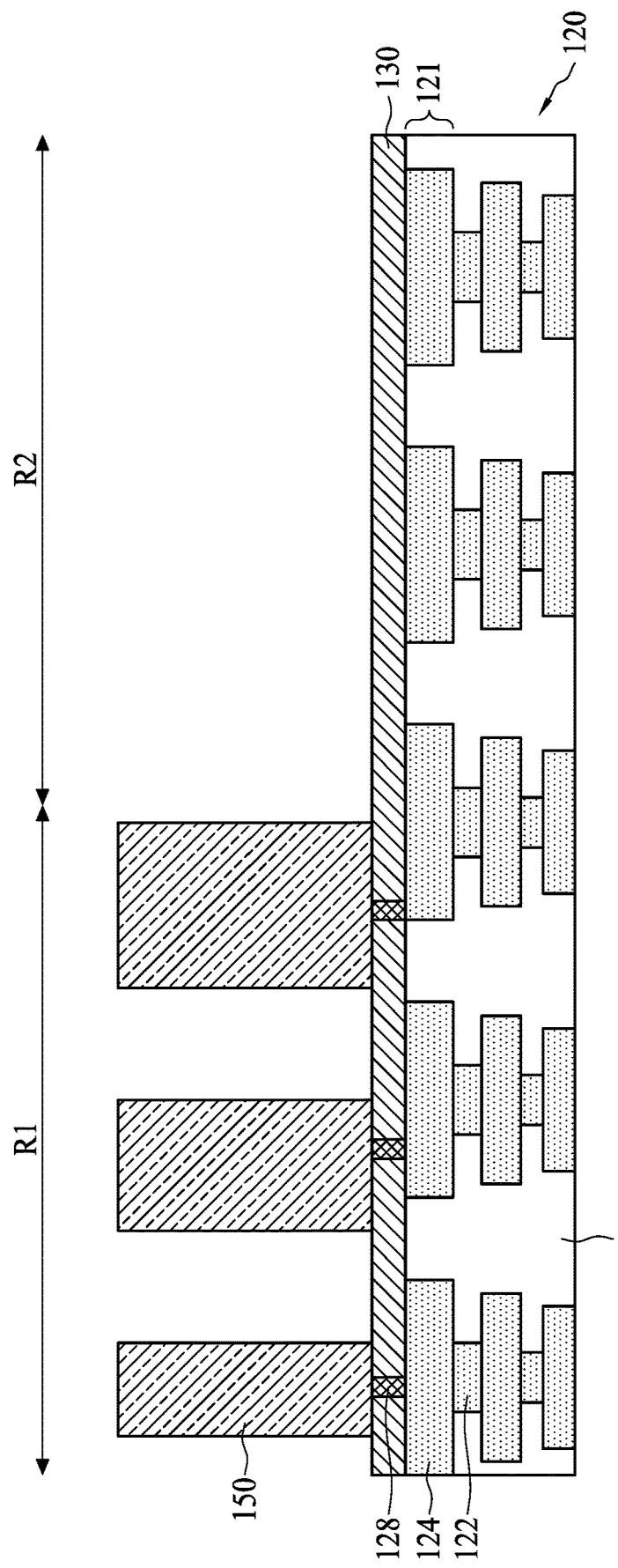

In operation 213 of FIG. 1, a redistribution layer (RDL) 150 is formed over the first dielectric layer 130 and defined by the photoresist pattern 140, as shown in FIGS. 11 and 12.

Referring to FIG. 11, a conductive material such as W, Cu, Co, Al, Ni, Ta, Ti, Mo, Pd, Pt, Ru, Ir, Ag, Au, TiN, TaN, the like, or a combination thereof is deposited into the openings O1 of the photoresist pattern 140 to form multiple conductive features on the conductive members 128. Such conductive features may be at least partially connected in the back of the paper and over the first dielectric layer 130 in the device region R1.

Referring to FIG. 12, the photoresist pattern 140 is removed using a wet clean operation or an ashing operation. As a result, the RDL 150 is formed. In some embodiments, the RDL 150 has a thickness between about 2000 nanometers (nm) and about 6000 nm. In some embodiments, due to the occupation of the photoresist pattern 140 in the peripheral region R2, no conductive features are formed over the first dielectric layer 130 in the peripheral region R2. The RDL 150 may be electrically coupled to the interconnect layer 120 via the conductive members 128.

Figure 13:
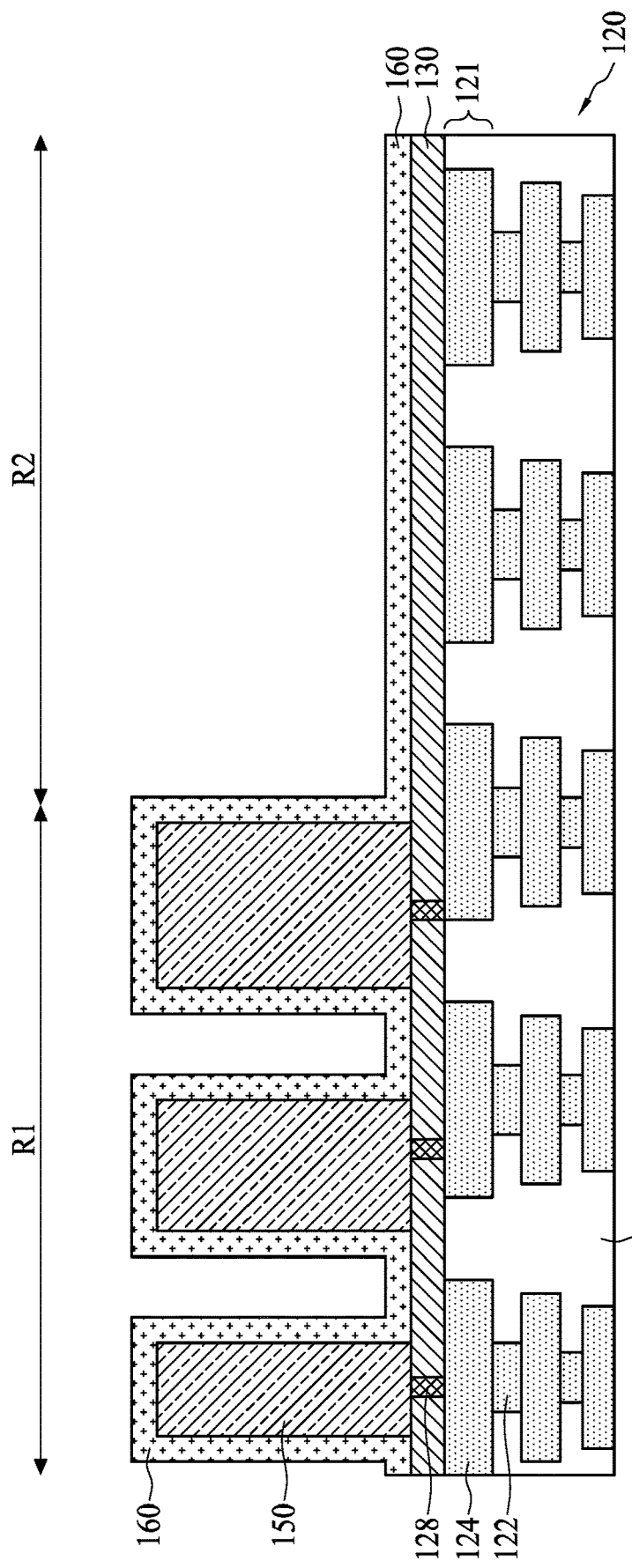

In operation 215 of FIG. 1, a second dielectric layer 160 is deposited on the RDL 150 and the first dielectric layer 130, as shown in FIG. 13. In some embodiments, the second dielectric layer 160 includes silicon nitride. A CVD or an ALD operation may be used to deposit silicon nitride over the first dielectric layer 130 and conformally along sidewalls of the RDL 150, thereby forming the second dielectric layer 160. In some embodiments, the second dielectric layer 160 has a thickness between about 7000 Å and about 20000 Å.

Figure 14:
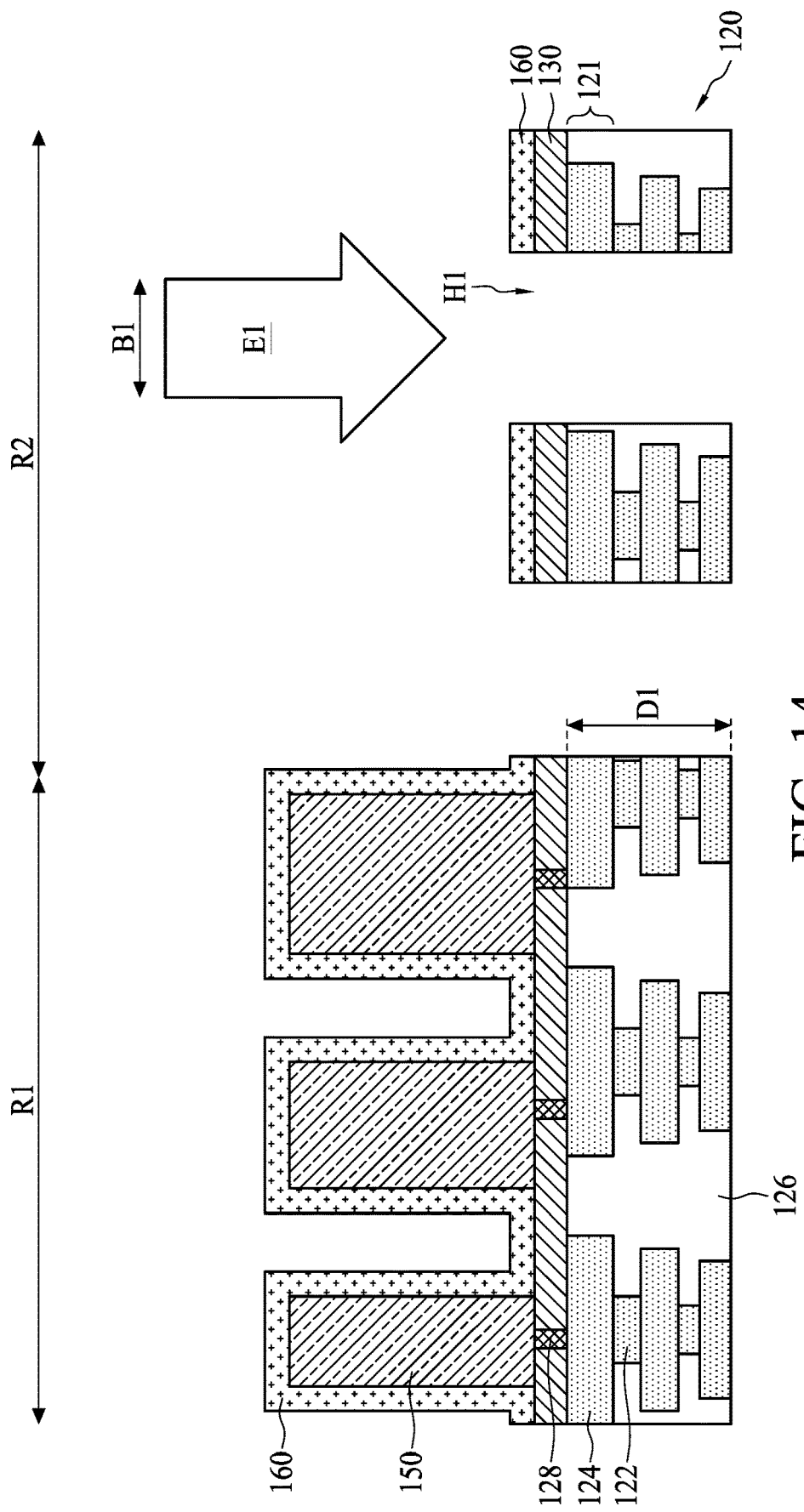
Figure 15:
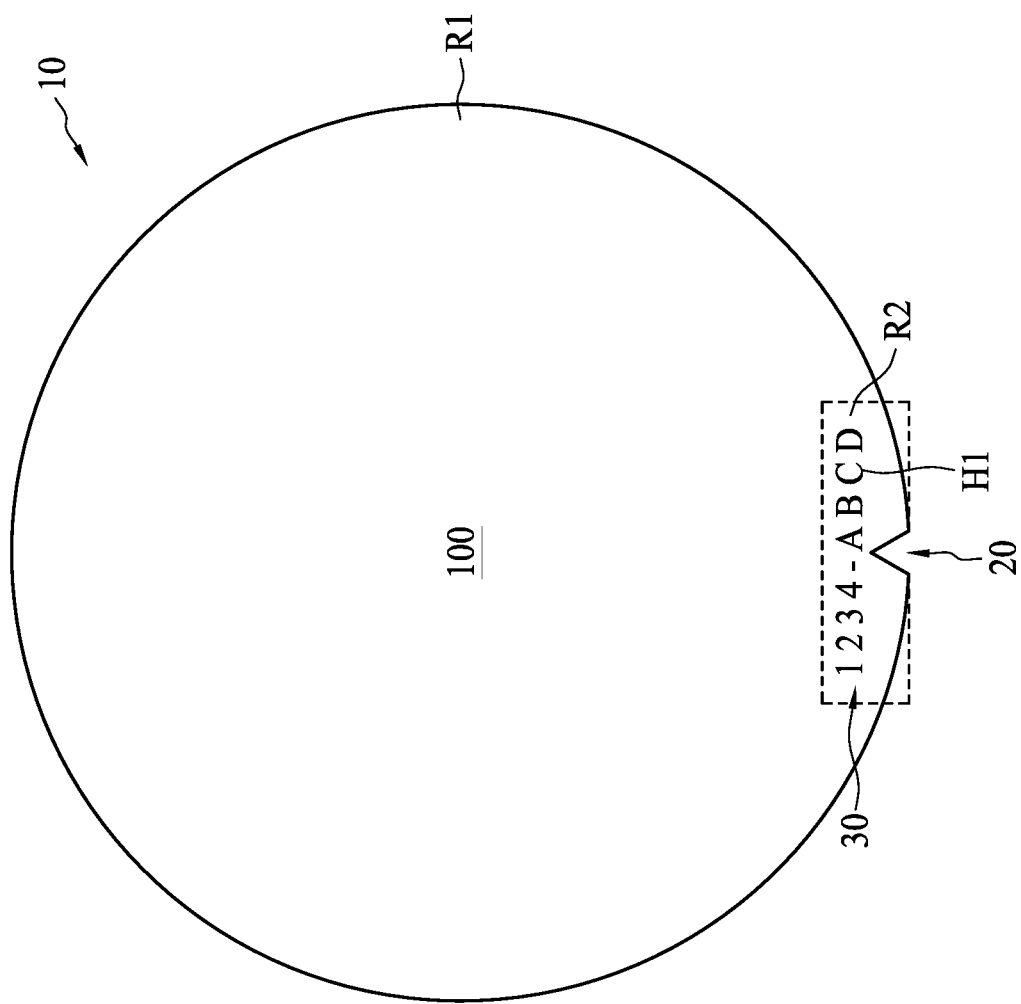
FIG. 15 is a top view of a semiconductor device including a mark formed by the method shown FIG. 1, in accordance with some embodiments of the present disclosure.

In operation 217 of FIG. 1, portions of the second dielectric layer 160, the first dielectric layer 130 and the interconnect layer 120 are removed, as shown in FIGS. 14 and 15. Referring to FIG. 14, in some embodiments, a laser drilling operation is performed on the peripheral region R2 of the substrate 100. The laser drilling operation uses a laser beam E1 movable over the peripheral region R2 of the substrate 100. In some embodiments, a beam diameter B1 of the laser beam E1 is between about 70 micrometers (μm) and about 100 μm. The laser beam E1 may be focused on a specific location of the second dielectric layer 160 and moved along a determined path to remove portions of the second dielectric layer 160, the first dielectric layer 130 and the interconnect layer 120. After the laser drilling operation, multiple holes H1 are formed in the peripheral region R2. The holes H1 may extend to a depth D1 of the interconnect layer 120 in the peripheral region R2. In some embodiments, the depth D1 is between about 8000 Å and about 55000 Å.

Referring to FIG. 15, which is a schematic top view of a semiconductor device 10 including a mark 30 formed by the method 200. In some embodiments, the holes H1 form the mark 30 in the peripheral region R2. The mark 30 may include multiple numbers or letters close to the notch 20 and in the peripheral region R2. The mark 30 may be an identification code of the substrate 100. In some embodiments, the mark 30 is adjacent to the notch 20. As a result, the mark 30 is formed on the semiconductor device 10 as shown in FIG. 15.

Within the thickness range of the first dielectric layer 130 and the second dielectric layer 160, the laser beam E1 can pass through the dielectric layers 130, 140 and to a depth of the interconnect layer 120 in the peripheral region R2. The holes H1 may have smooth and straight sidewalls. Therefore, the mark 30 formed using the method 200 is clearly legible and high-contrast.

Figure 16:
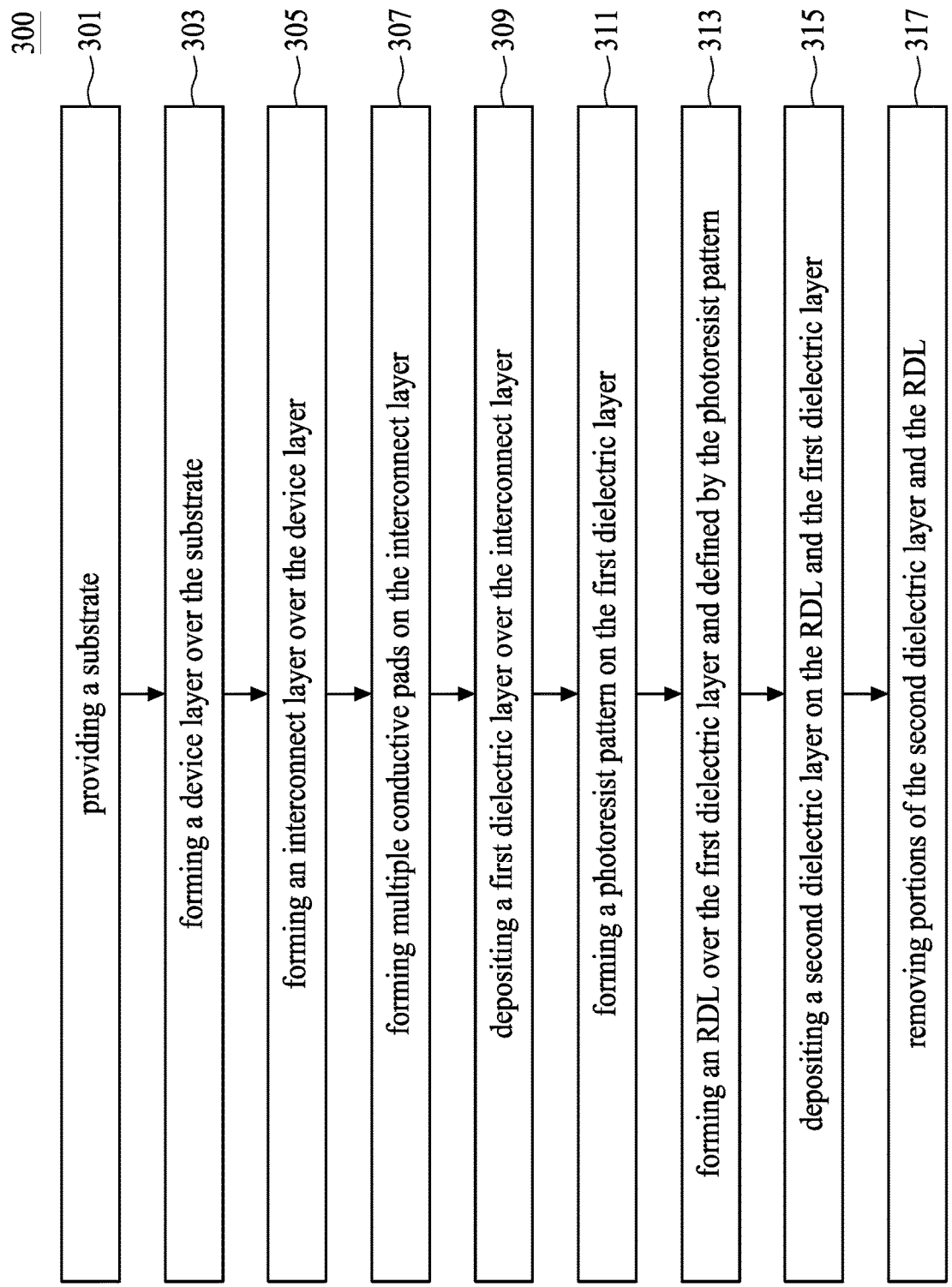
FIG. 16 is a flow diagram showing another method of forming a mark on a semiconductor device, in accordance with some embodiments of the present disclosure.

FIG. 16 is a flow diagram showing a method 300 of forming a mark on a semiconductor device. FIGS. 17 to 22 are schematic cross-sectional views illustrating sequential operations of the method 300 shown in FIG. 16. The method 300 includes a number of operations (301, 303, 305, 307, 309, 311, 313, 315 and 317) and the description and illustration are not deemed as a limitation to the sequence of the operations.

Operations 301, 303, 305, 307 and 309 are the same as operations 201, 203, 205, 207 and 209, and the related schematic cross-sectional and top views are shown in FIGS. 2 to 7.

Figure 17:
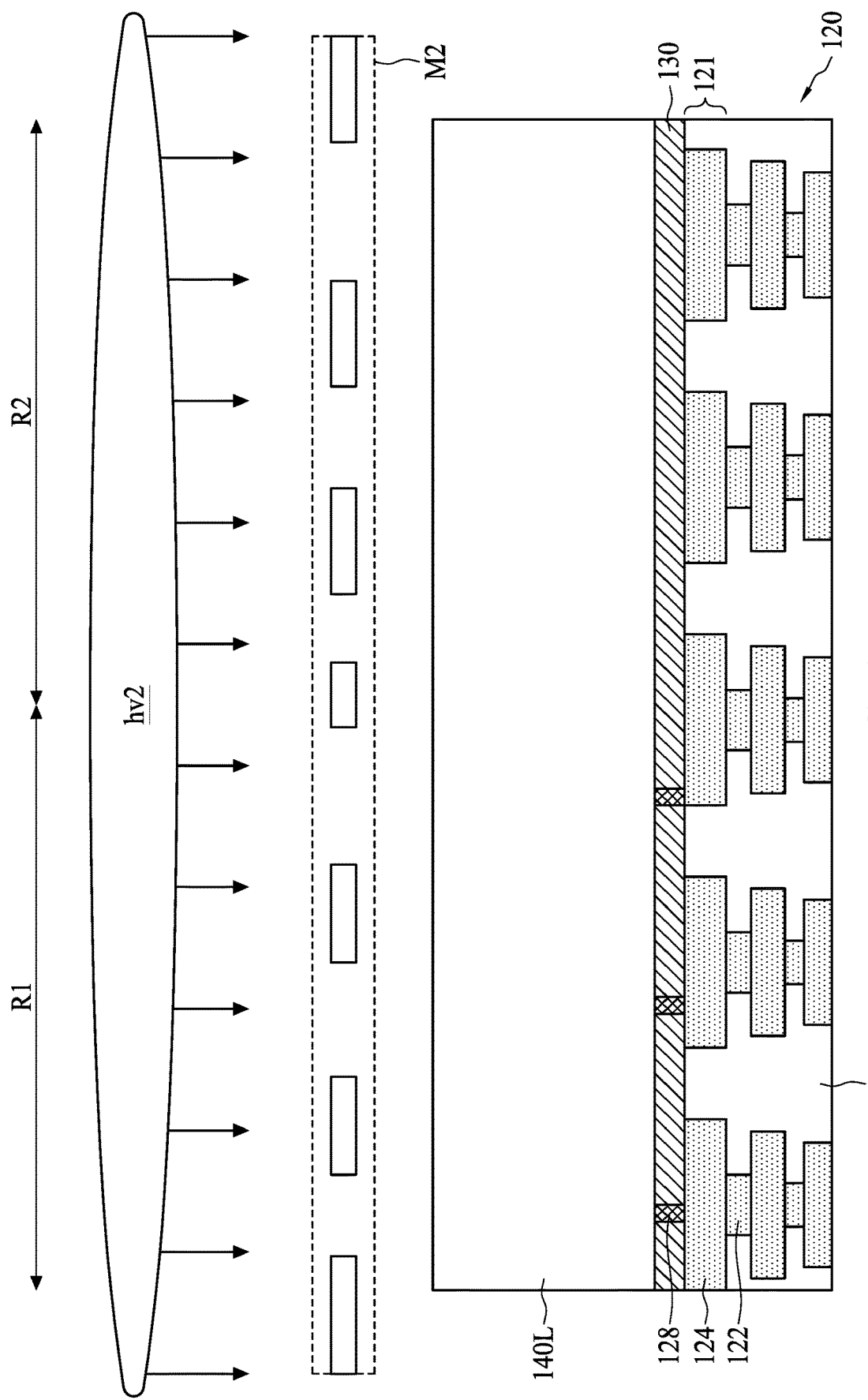
FIGS. 17 to 22 are schematic cross-sectional views illustrating sequential operations of the method shown in FIG. 16, in accordance with some embodiments of the present disclosure.
Figure 18:
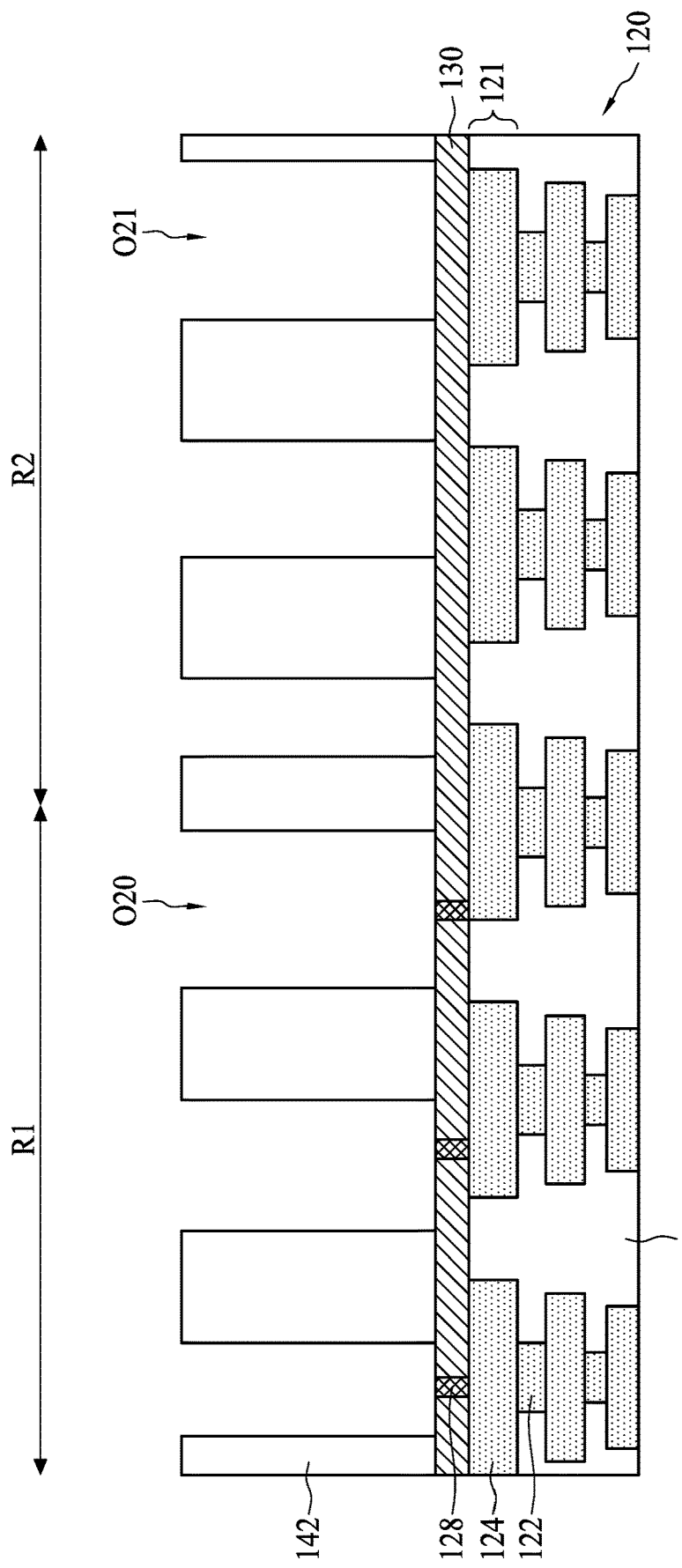

In operation 311 of FIG. 16, a photoresist pattern 142 is formed on the first dielectric layer 130, as shown in FIGS. 17 and 18. Referring to FIG. 17, which is continued from FIG. 8, the photoresist layer 140L is exposed to a radiation hv2 such as DUV or EUV through a photomask M2. In some embodiments, portions of the photoresist layer 140L in the device region R1 and the peripheral region R2 are exposed to the radiation hv2 when the photomask M2 is used.

Referring to FIG. 18, the exposed photoresist layer 140L is developed, and the photoresist pattern 142 is thereby formed. In some embodiments, the pattern of the photomask M2 is transferred to the photoresist pattern 142 on the device region R1 and the peripheral region R2. The photoresist pattern 142 may have a thickness between about 20000 Å and about 60000 Å. In some embodiments, the photoresist pattern 142 includes multiple openings O20 that expose the conductive members 128 and portions of the first dielectric layer 130 in the device region R1. In some embodiments, the photoresist pattern 142 includes multiple openings O21 that expose portions of the first dielectric layer 130 in the peripheral region R2. The first dielectric layer 130 in the peripheral region R2 is at least partially exposed through the photoresist pattern 142.

Figure 19:
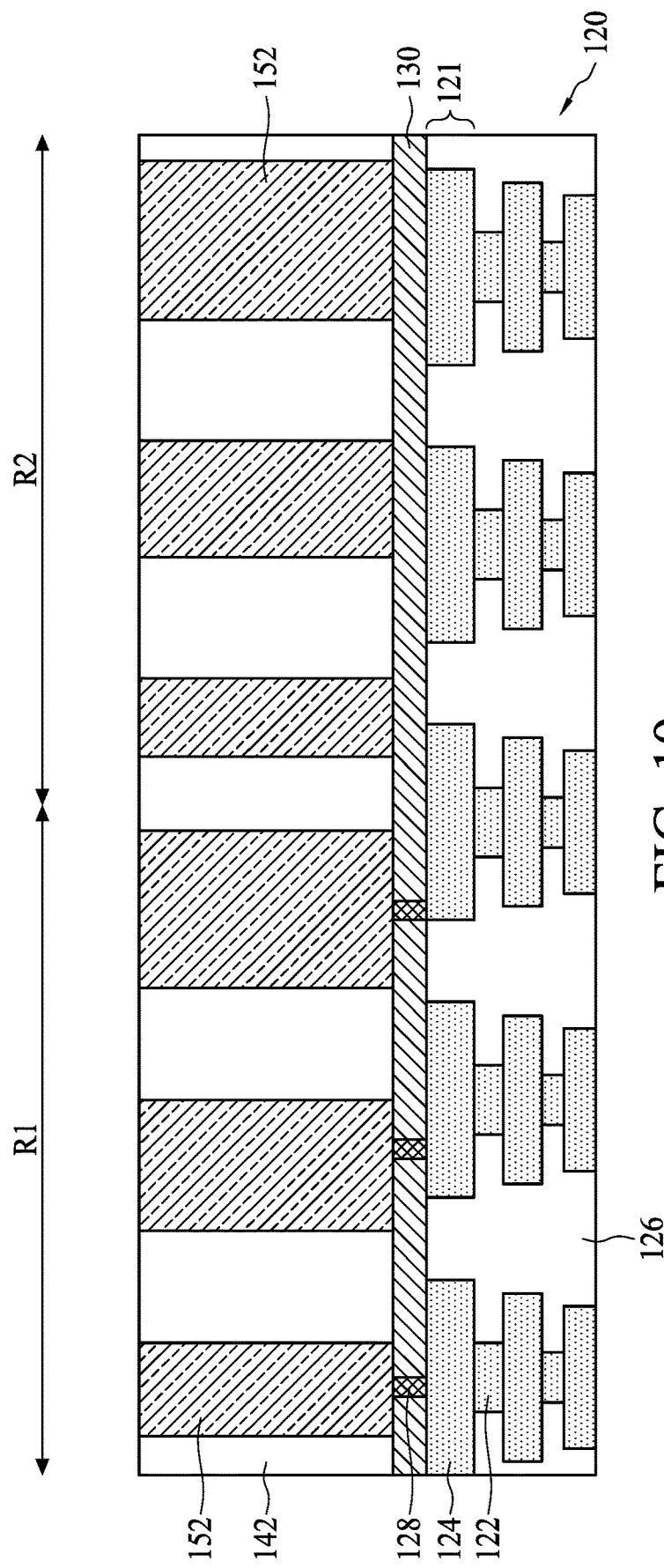
Figure 20:
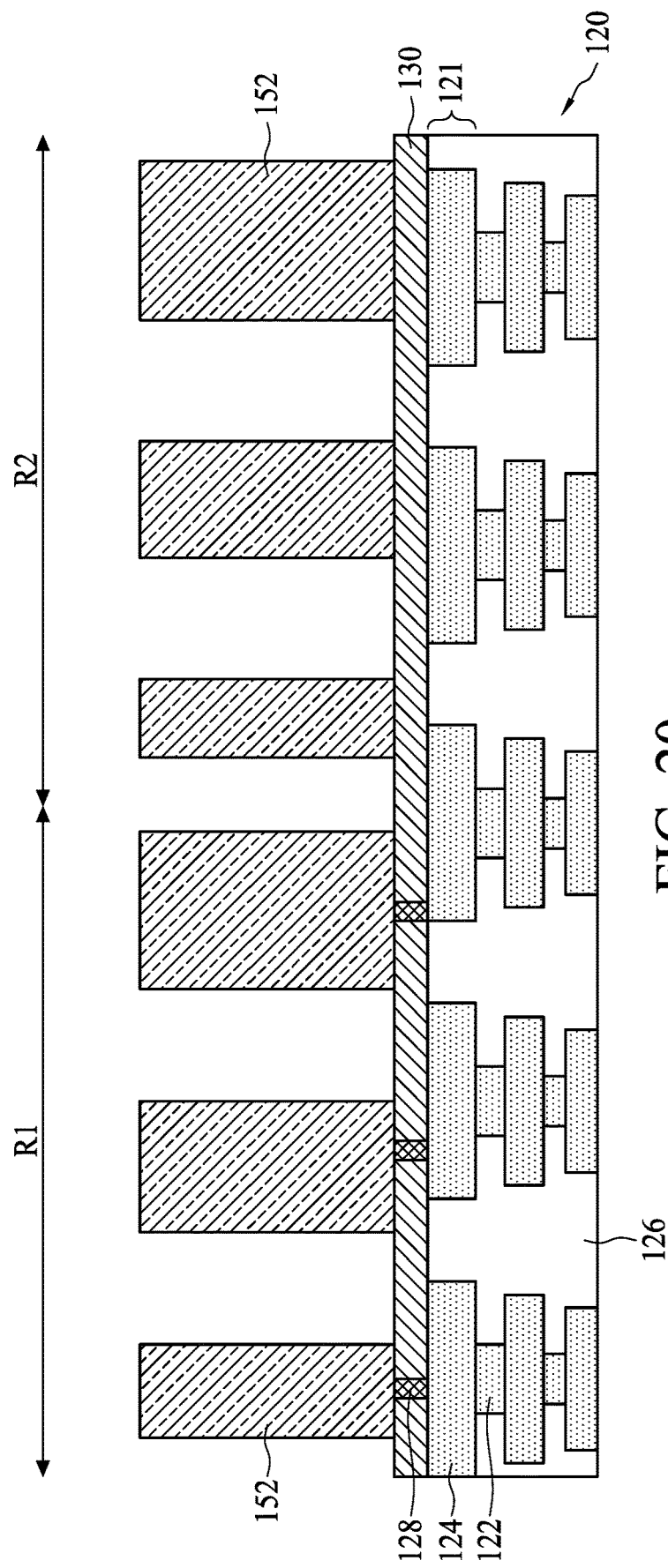

In operation 313 of FIG. 16, an RDL 152 is formed over the first dielectric layer 130 and defined by the photoresist pattern 142, as shown in FIGS. 19 and 20. Referring to FIG. 19, a conductive material is deposited into the openings O20 and O21 of the photoresist pattern 142 to form multiple conductive features on the first dielectric layer 130. Such conductive features may be at least partially connected in the back of the paper and over the first dielectric layer 130 in the device region R1.

Referring to FIG. 20, the photoresist pattern 142 is removed using a wet clean operation or an ashing operation. As a result, the RDL 152 is formed. In some embodiments, the RDL 152 has a thickness between about 2000 nm and about 6000 nm. In some embodiments, the RDL 152 is formed over the first dielectric layer 130 in the device region R1 and the peripheral region R2. The RDL 152 in the device region R1 may be electrically coupled to the interconnect layer 120 via the conductive members 128.

Figure 21:
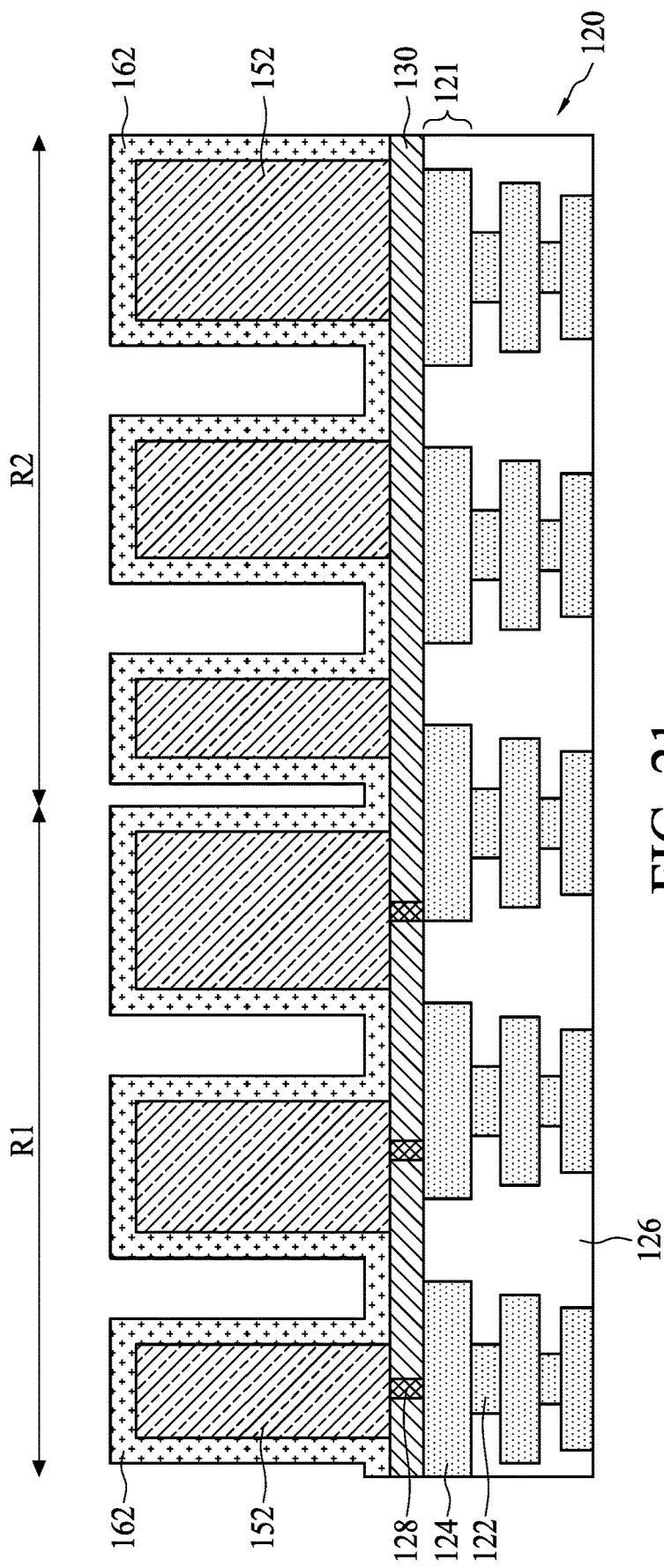

In operation 315 of FIG. 16, a second dielectric layer 162 is deposited on the RDL 152 and the first dielectric layer 130, as shown in FIG. 21. In some embodiments, the second dielectric layer 162 includes silicon nitride. A CVD or an ALD operation may be used to deposit silicon nitride over the first dielectric layer 130 exposed through the RDL 152 and conformally along sidewalls of the RDL 152, thereby forming the second dielectric layer 162. In some embodiments, the second dielectric layer 162 has a thickness between about 7000 Å and about 20000 Å.

Figure 22:
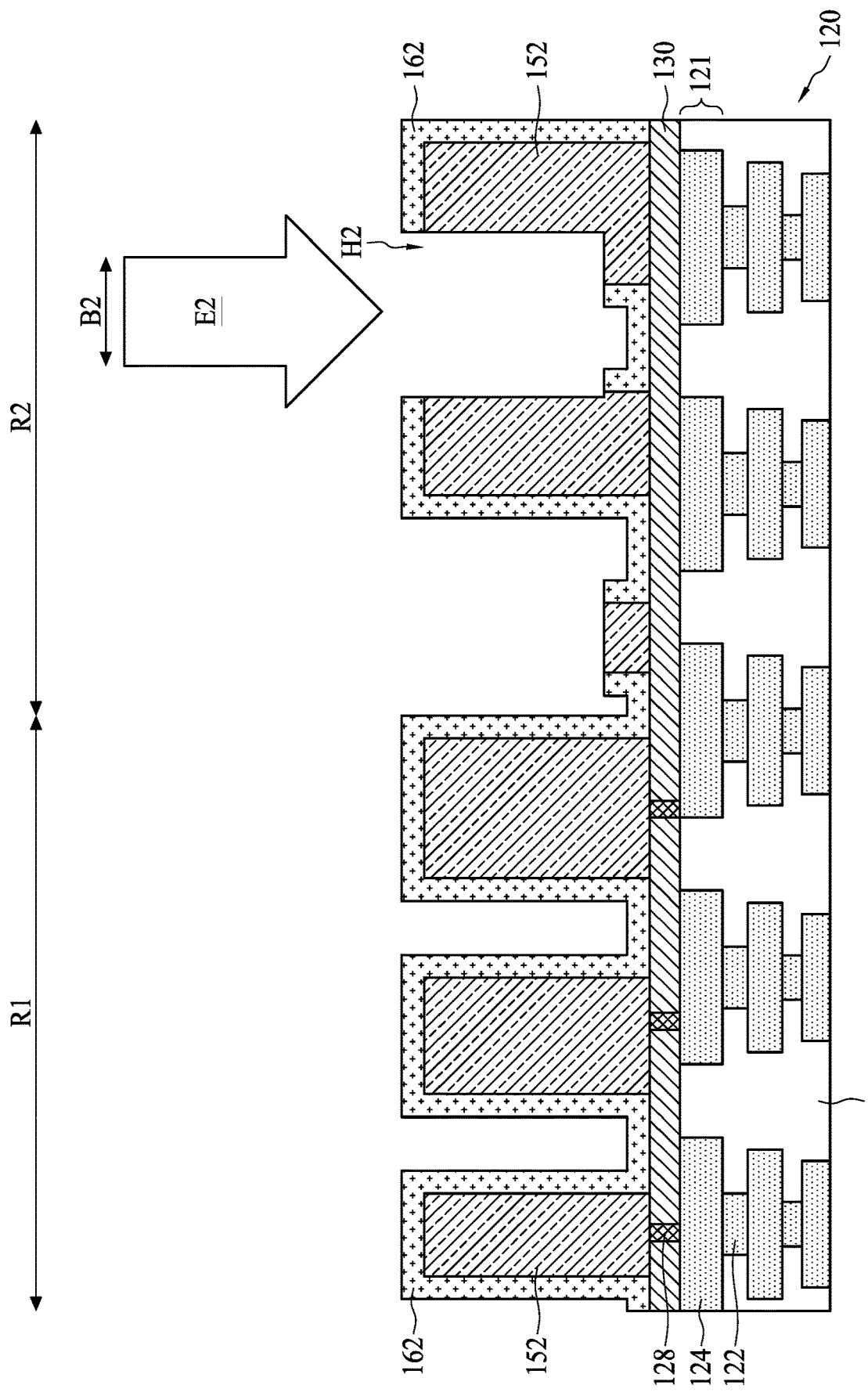

In operation 317 of FIG. 16, portions of the second dielectric layer 162 and the RDL 152 are removed, as shown in FIG. 22. In some embodiments, a laser drilling operation is performed on the peripheral region R2 of the substrate 100. The laser drilling operation uses a laser beam E2 movable over the peripheral region R2 of the substrate 100. In some embodiments, a beam diameter B2 of the laser beam E2 is between about 70 μm and about 100 μm. The laser beam E2 may be focused on a specific location of the second dielectric layer 162 and moved along a determined path to remove portions of the second dielectric layer 162 and the RDL 152. After the laser drilling operation, multiple holes H2 are formed in the peripheral region R2. The holes H2 may extend to a predetermined height of the RDL 152 in the peripheral region R2.

In some embodiments, due to the patterns of the RDL 152, a surface roughness in the peripheral region R2 is increased. The laser beam E2 can be reflected or scattered by the RDL 152 in the peripheral region R2. In such embodiments, not only the laser beam E2 itself but also reflected lights of the laser beam E2 are capable of engraving the second dielectric layer 162 and the RDL 152 in the peripheral region R2. As a result, removed portions of second dielectric layer 162 and the RDL 152 form the holes H2. The holes H2 may have smooth and straight sidewalls. Still referring to FIG. 15, in some embodiments, the holes H2 form the mark 30 in the peripheral region R2. Referring to FIGS. 22 and 15, in some embodiments, the mark 30 formed using the method 300 is disposed above the first dielectric layer 130 and the interconnect layer 120.

Figure 23:
FIG. 23 is a flow diagram showing another method of forming a mark on a semiconductor device, in accordance with some embodiments of the present disclosure.

FIG. 23 is a flow diagram showing a method 400 of forming a mark on a semiconductor device. FIGS. 24 to 30 are schematic cross-sectional and top views illustrating sequential operations of the method 400 shown in FIG. 23. The method 400 includes a number of operations (401, 403, 405, 407, 409, 411, 413, 415, 417 and 419) and the description and illustration are not deemed as a limitation to the sequence of the operations.

Operations 401, 403, 405, 407, 409 and 411 are the same as operations 201, 203, 205, 207, 209 and 211, and the related schematic cross-sectional and top views are shown in FIGS. 2 to 10.

Figure 24:
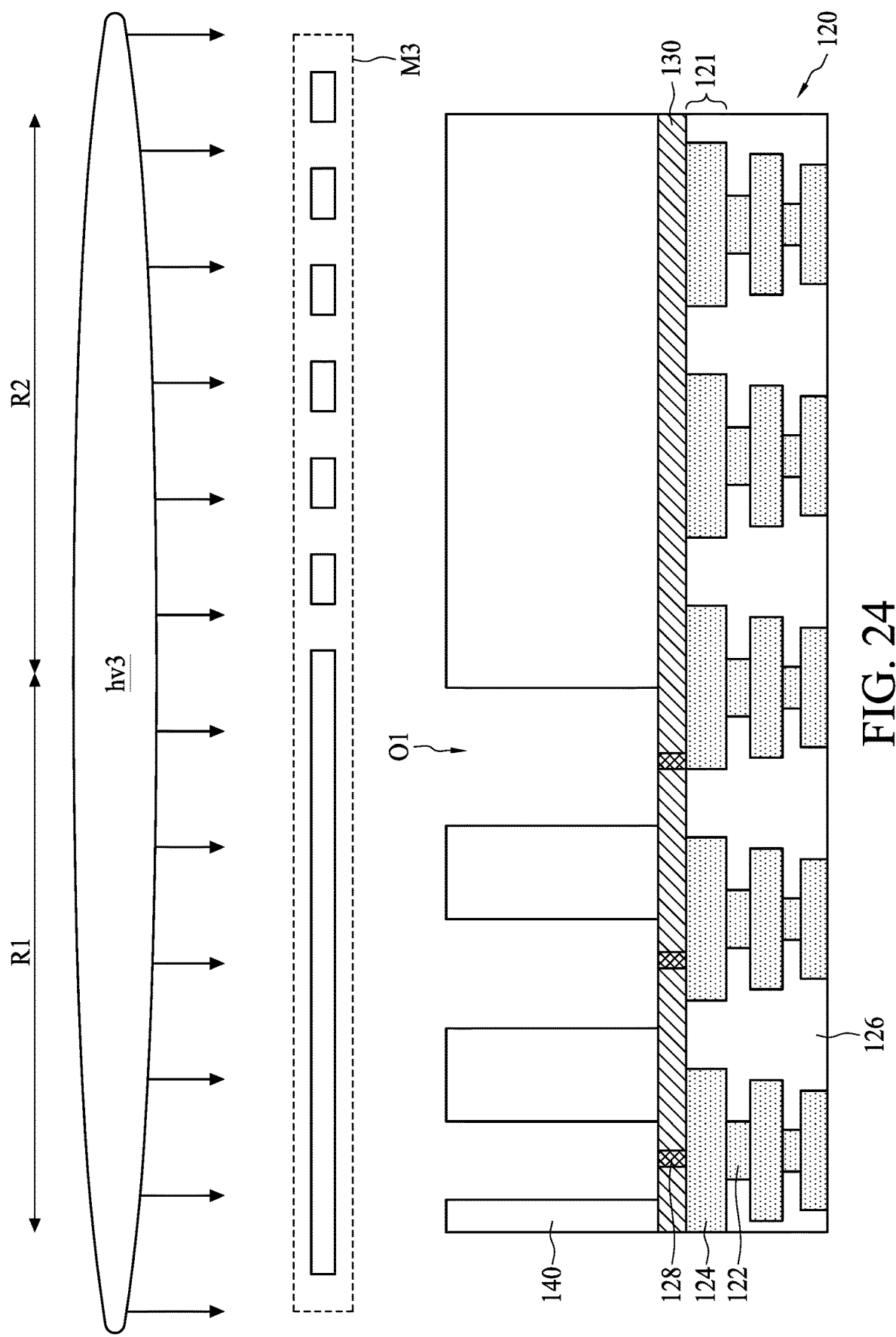
FIGS. 24 to 30 are schematic cross-sectional and top views illustrating sequential operations of the method shown in FIG. 23, in accordance with some embodiments of the present disclosure.
Figure 25:
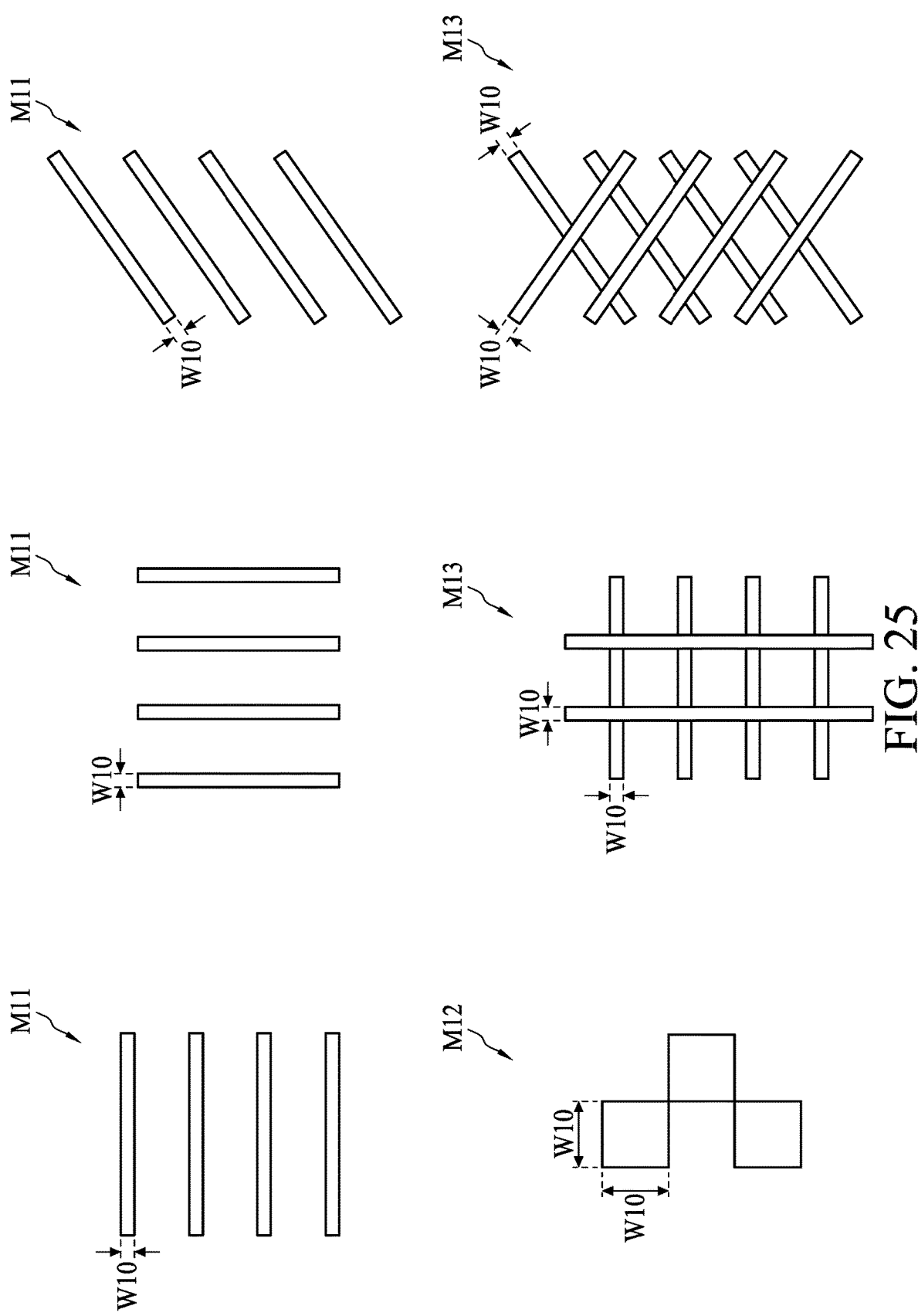
Figure 26:
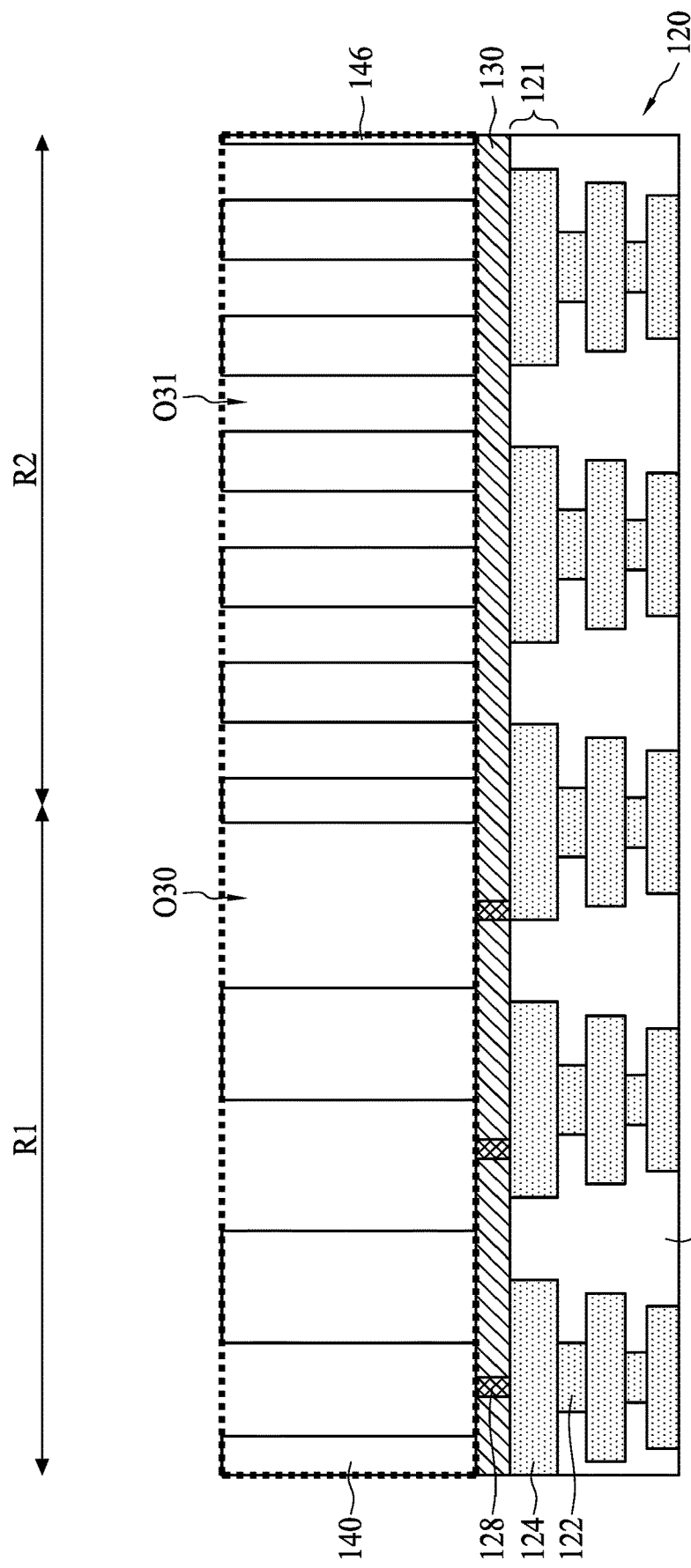

In operation 413 of FIG. 23, photoresist patterns 144 and 146 are formed on the first dielectric layer 130, as shown in FIGS. 24 to 26. Referring to FIG. 24, which is continued from FIG. 10, the photoresist pattern 140 is exposed to a radiation hv3 such as DUV or EUV through a photomask M3. In some embodiments, portions of the photoresist pattern 140 in the peripheral region R2 are exposed to the radiation hv3 when the photomask M3 is used.

Referring to FIG. 25, the photomask M3 may include various patterns. In some embodiments, the photomask M3 includes a line pattern M11 such as horizontal lines, vertical lines or oblique lines. In some embodiments, the photomask M3 includes a polygon pattern M12 such as squares. In some embodiments, the photomask M3 includes a cross pattern M13 such as a grid or an interlace. The photomask M3 may include one of the patterns M11 to M13 or a combination of the patterns M11 to M13. In some embodiments, each line of the patterns M11 to M13 has a width W10 less than 30 μm.

Referring to FIG. 26, the exposed photoresist pattern 140 is developed, and the photoresist patterns 144 and 146 are thereby formed. In some embodiments, the pattern of the photomask M1 is transferred to the photoresist pattern 144 on the device region R1, and the pattern of the photomask M3 is transferred to the photoresist pattern 146 on the peripheral region R2. Each of the photoresist patterns 144 and 146 may have a thickness between about 20000 Å and about 60000 Å. In some embodiments, the photoresist pattern 144 includes multiple openings O30 that expose the conductive members 128 and portions of the first dielectric layer 130 in the device region R1. The openings O30 in FIG. 30 may be the same as the openings O1 in FIG. 10. In some embodiments, the photoresist pattern 146 includes multiple openings O31 that expose portions of the first dielectric layer 130 in the peripheral region R2. The first dielectric layer 130 in the peripheral region R2 is at least partially exposed through the photoresist pattern 146.

Figure 27:
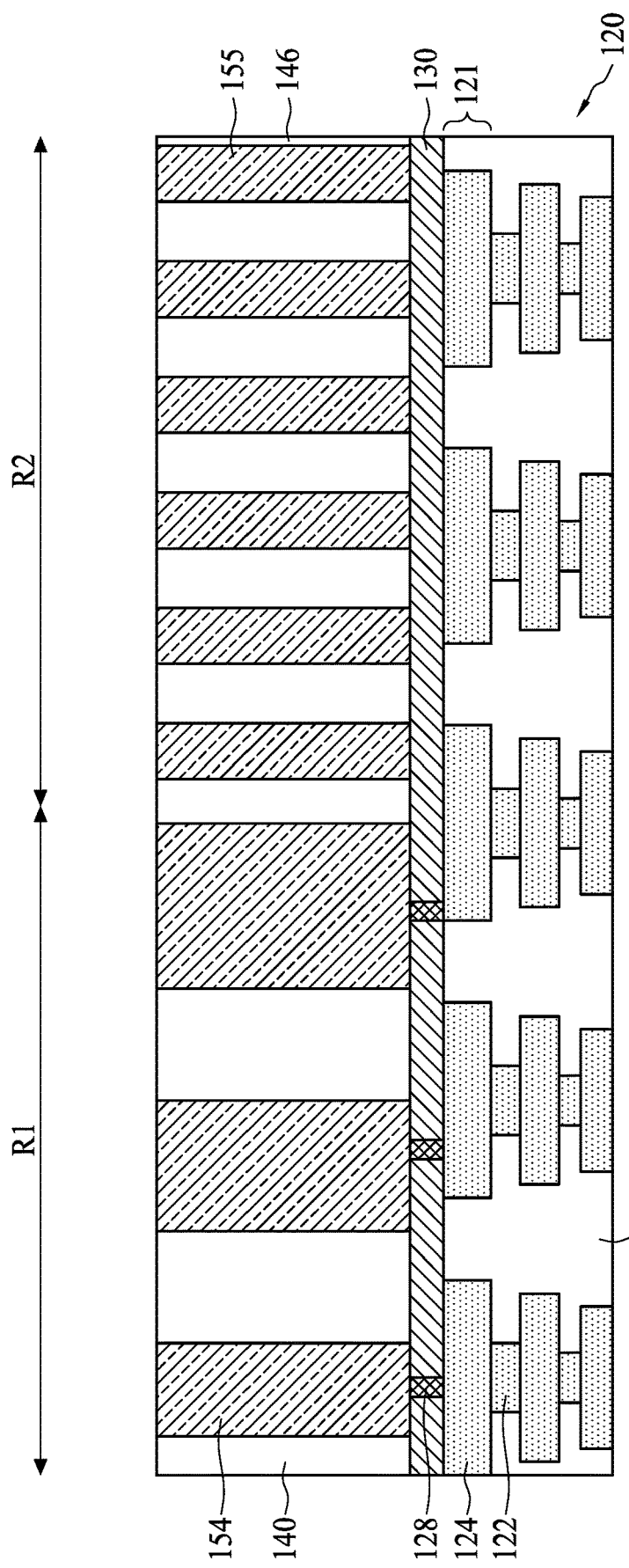
Figure 28:
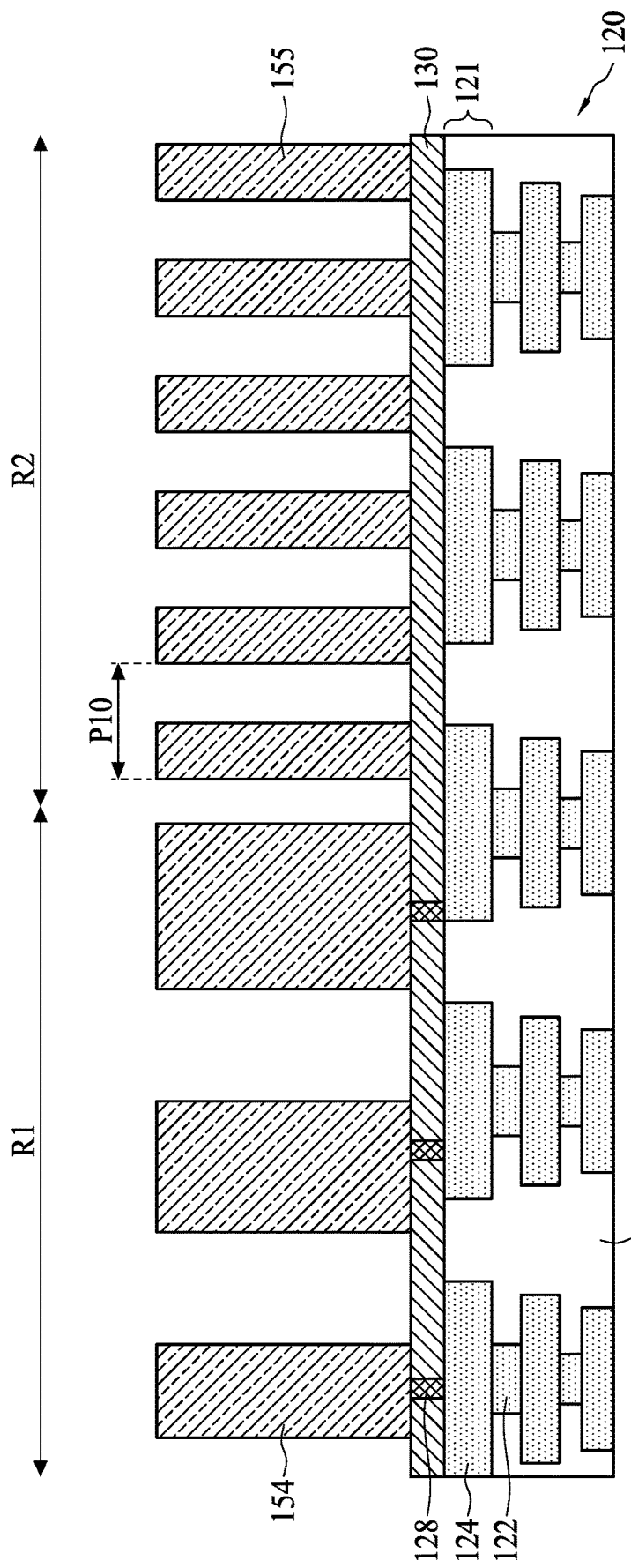

In operation 415 of FIG. 23, an RDL 154 is formed over the first dielectric layer 130, as shown in FIGS. 27 and 28. Referring to FIG. 27, a conductive material is deposited into the openings O30 of the photoresist pattern 144 and openings O31 of the photoresist pattern 146 to form multiple conductive features on the first dielectric layer 130. Such conductive features may be at least partially connected in the back of the paper and over the first dielectric layer 130 in the device region R1.

Referring to FIG. 28, the photoresist patterns 144 and 146 are removed using a wet clean operation or an ashing operation. As a result, the RDL 154 is formed on the first dielectric layer 130 in the device region R1, and conductive features 155 are formed on the first dielectric layer 130 in the peripheral region R2. In some embodiments, the RDL 154 has a thickness between about 2000 nm and about 6000 nm. The RDL 154 may be electrically coupled to the interconnect layer 120 via the conductive members 128. In some embodiments, the conductive features 155 have a predetermined pitch P10. In some embodiments, the photoresist pattern 146 is a dummy pattern. That is, the photoresist pattern 146 is not used for forming a real RDL layout in the peripheral region R2; instead, the photoresist pattern 146 is used to form some patterns such as the conductive features 155 in the peripheral region R2. The conductive features 155 in the peripheral region R2 is not a functional circuit but can increase the surface roughness of the peripheral region R2. The conductive features 155 in the peripheral region R2 may be referred to as dummy features.

Figure 29:
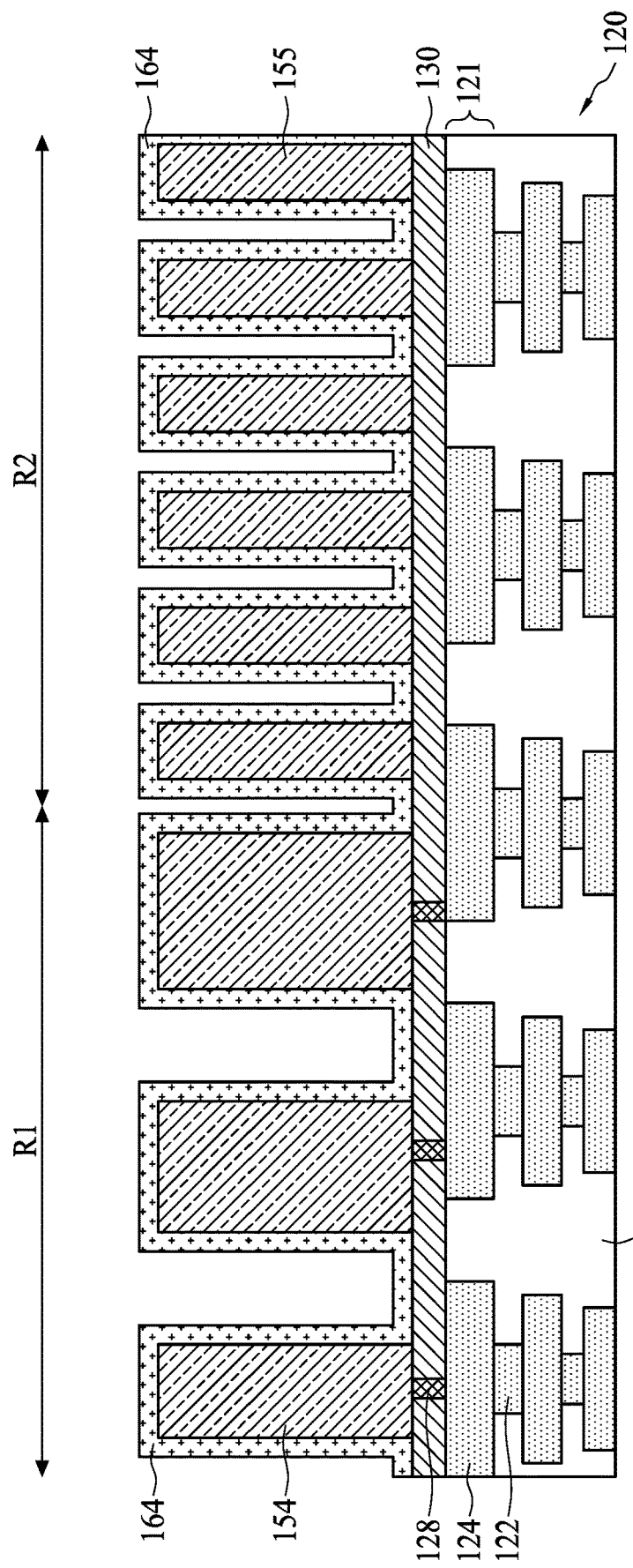

In operation 417 of FIG. 23, a second dielectric layer 164 is deposited on the RDL 154, the conductive features 155 and the first dielectric layer 130, as shown in FIG. 29. In some embodiments, the second dielectric layer 164 includes silicon nitride. A CVD or an ALD operation may be used to deposit silicon nitride over the first dielectric layer 130 exposed through the RDL 154 and the conductive features 155, and conformally along sidewalls of the RDL 154, thereby forming the second dielectric layer 164. In some embodiments, the second dielectric layer 164 has a thickness between about 7000 Å and about 20000 Å.

Figure 30:
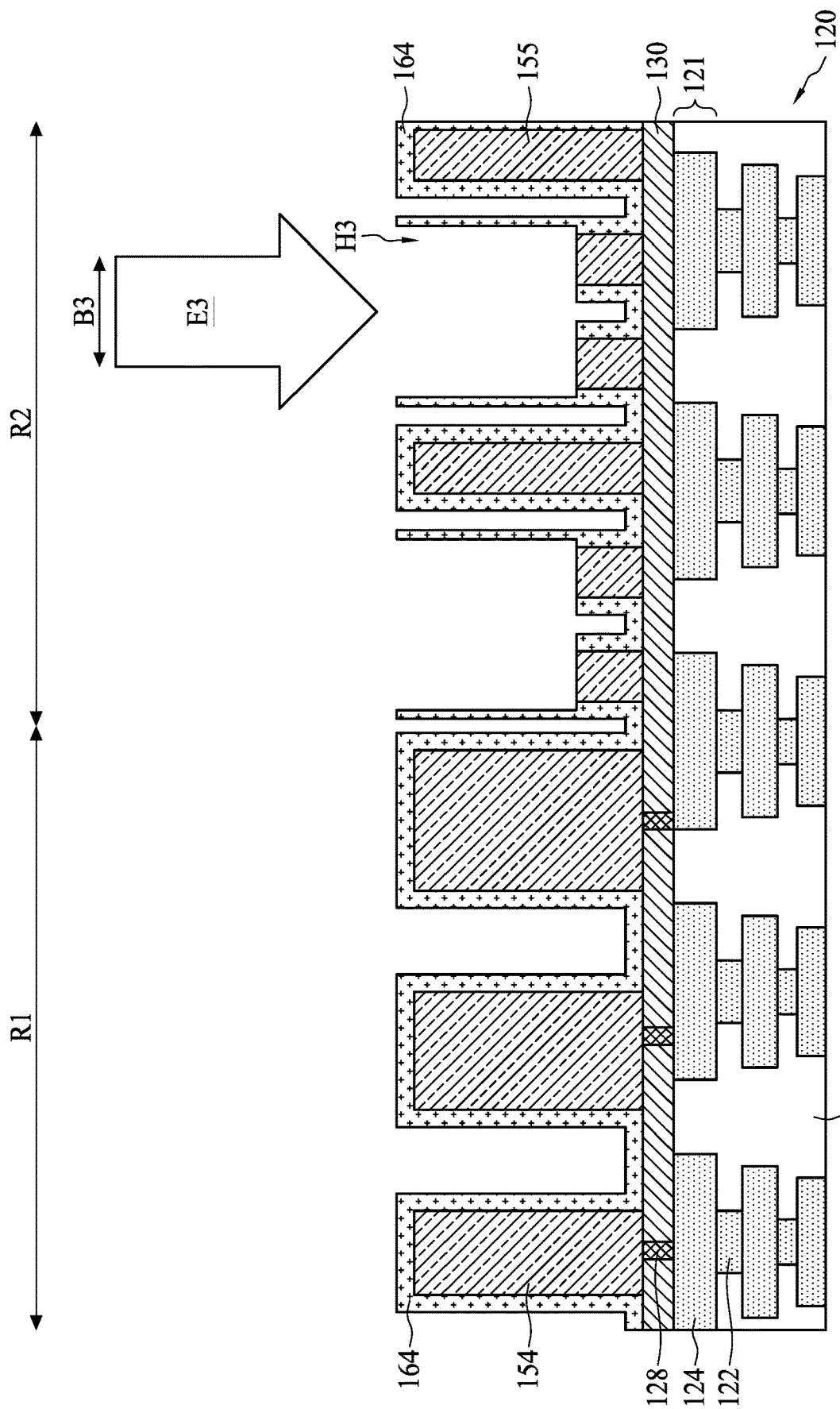

In operation 419 of FIG. 23, portions of the second dielectric layer 164 and the conductive features 155 are removed, as shown in FIG. 30. In some embodiments, a laser drilling operation is performed on the peripheral region R2 of the substrate 100. The laser drilling operation uses a laser beam E3 movable over the peripheral region R2 of the substrate 100. In some embodiments, a beam diameter B3 of the laser beam E3 is between about 70 μm and about 100 μm. In some embodiments, the beam diameter B3 is greater than the pitch P10. The laser beam E3 may be focused on a specific location of the second dielectric layer 164 and moved along a determined path to remove portions of the second dielectric layer 164 and the conductive features 155. After the laser drilling operation, multiple holes H3 are formed in the peripheral region R2. The holes H3 may extend to a predetermined height of the conductive features 155.

In some embodiments, due to the patterns of the RDL 154, a surface roughness of the peripheral region R2 is increased. The laser beam E3 can be reflected or scattered by the conductive features 155. In such embodiments, not only the laser beam E3 itself but also reflected lights of the laser beam E3 are capable of engraving the second dielectric layer 164 and the conductive features 155 in the peripheral region R2. As a result, removed portions of second dielectric layer 164 and the conductive features 155 form the holes H3. The holes H3 may have smooth and straight sidewalls. Still referring to FIG. 15, in some embodiments, the holes H3 form the mark 30 in the peripheral region R2. Referring to FIGS. 30 and 15, in some embodiments, the mark 30 formed using the method 400 is disposed above the first dielectric layer 130 and the interconnect layer 120.

The present disclosure provides different methods to form a laser mark. For example, in some embodiments, metal formation is minimized in the peripheral region near the notch of a wafer. Therefore, the laser beam can drill the peripheral region with less resistance to form a mark. In some other embodiments, conductive features are also formed in the peripheral region of a wafer. The trenches of such conductive features increase surface roughness of the peripheral region. Therefore, the laser beam does not hit a drill a bulk of metal while engrave the conductive features to form a mark.

The methods provided by the present disclosure can render subsequent operations to proceed more smoothly. For example, in bumping or package operations, a legible laser mark enables fab engineers to check the manufacturing process of a wafer more easily.

One aspect of the present disclosure provides a method for manufacturing a semiconductor device having a mark. The method includes: providing a substrate including a device region and a peripheral region adjacent to the device region; forming an interconnect layer over the substrate; depositing a first dielectric layer on the interconnect layer; forming a redistribution layer (RDL) over the first dielectric layer in the device region; depositing a second dielectric layer on the RDL in the device region and the first dielectric layer in the device region and the peripheral region; and removing portions of the second dielectric layer, the first dielectric layer and the interconnect structure in the peripheral region to form the mark in the peripheral region.

One aspect of the present disclosure provides another method for manufacturing a semiconductor device having a mark. The method includes: providing a substrate defined with a device region and a peripheral region adjacent to the device region; forming an interconnect layer over the substrate; depositing a first dielectric layer on the interconnect structure; forming a photoresist pattern on the first dielectric layer, wherein the first dielectric layer in the peripheral region is at least partially exposed through the photoresist pattern; disposing a conductive material on the first dielectric layer exposed through the photoresist pattern to form a conductive feature over the first dielectric layer; removing the photoresist pattern; conformally forming a second dielectric layer on the conductive feature and the first dielectric layer exposed through the conductive feature; and engraving portions of the conductive feature and the second dielectric layer in the peripheral region to form the mark in the peripheral region.

One aspect of the present disclosure provides another method for manufacturing a semiconductor device having a mark. The method includes: providing a substrate defined with a device region and a peripheral region adjacent to the device region; forming an interconnect layer over the substrate; depositing a first dielectric layer on the interconnect layer; forming a first photoresist pattern on the first dielectric layer in the device region and a second photoresist pattern on the first dielectric layer in the peripheral region; filling a conductive material into openings of the first and second photoresist patterns to form a first conductive pattern in the device region and a second conductive pattern in the peripheral region; removing the first photoresist pattern and the second photoresist pattern; conformally forming a second dielectric layer on the first conductive pattern, the second conductive pattern and the first dielectric layer; and engraving portions of the second dielectric layer and the second conductive pattern by laser.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device having a mark, the method comprising:
    providing a substrate including a device region and a peripheral region adjacent to the device region;
    forming an interconnect layer over the substrate;
    depositing a first dielectric layer on the interconnect layer;
    forming a redistribution layer (RDL) over the first dielectric layer in the device region;
    depositing a second dielectric layer on the RDL in the device region and the first dielectric layer in the device region and the peripheral region; and
    removing portions of the second dielectric layer, the first dielectric layer and the interconnect structure in the peripheral region to form the mark in the peripheral region.

2. The method of claim 1, wherein the removal of the portions of the first dielectric layer, the second dielectric layer and the interconnect structure includes a laser drilling operation.

3. The method of claim 1, wherein a thickness of the first dielectric layer is between about 9000 angstroms (Å) and about 15000 Å, a thickness of the second dielectric layer is between about 7000 Å and about 20000 Å, and a thickness of the RDL is between about 20000 Å and about 60000 Å.

4. The method of claim 1, wherein the device region is substantially greater than the peripheral region.

5. The method of claim 1, wherein the peripheral region has a width between about 7 millimeters (mm) and about 10 mm and a length between about 60 mm and about 65 mm.

6. The method of claim 1, wherein the substrate has a notch in the peripheral region, and the mark is adjacent to the notch.

7. The method of claim 1, wherein the mark extends to a top portion of the interconnect structure in the peripheral region.

8. The method of claim 1, further comprising:
    forming a photoresist pattern on the first dielectric layer, wherein the photoresist pattern completely covers the first dielectric layer in the peripheral region and partially covers the first dielectric layer in the device region; and
    removing the photoresist pattern after the formation of the RDL.

9. A method for manufacturing a semiconductor device having a mark, the method comprising:
    providing a substrate defined with a device region and a peripheral region adjacent to the device region;

forming an interconnect layer over the substrate;

depositing a first dielectric layer on the interconnect structure;

forming a photoresist pattern on the first dielectric layer, wherein the first dielectric layer in the peripheral region is at least partially exposed through the photoresist pattern;

disposing a conductive material on the first dielectric layer exposed through the photoresist pattern to form a conductive feature over the first dielectric layer;

removing the photoresist pattern;

conformally forming a second dielectric layer on the conductive feature and the first dielectric layer exposed through the conductive feature; and engraving portions of the conductive feature and the second dielectric layer in the peripheral region to form the mark in the peripheral region.

10. The method of claim 9, wherein the first and second dielectric layers include oxide or nitride.

11. The method of claim 9, wherein the forming of the photoresist pattern includes transferring a pattern of a single photomask to the photoresist pattern in the device region and the peripheral region.

12. The method of claim 9, wherein the mark is disposed above the first dielectric layer and the interconnect layer.

13. The method of claim 9, wherein the engraving is implemented by laser.

14. The method of claim 9, wherein the mark includes a plurality of numbers or letters in the peripheral region.

15. A method for manufacturing a semiconductor device having a mark, the method comprising:

providing a substrate defined with a device region and a peripheral region adjacent to the device region;

forming an interconnect layer over the substrate;

depositing a first dielectric layer on the interconnect layer;

forming a first photoresist pattern on the first dielectric layer in the device region and a second photoresist pattern on the first dielectric layer in the peripheral region;

filling a conductive material into openings of the first and second photoresist patterns to form a first conductive pattern in the device region and a second conductive pattern in the peripheral region;

removing the first photoresist pattern and the second photoresist pattern;

conformally forming a second dielectric layer on the first conductive pattern, the second conductive pattern and the first dielectric layer; and engraving portions of the second dielectric layer and the second conductive pattern by laser.

16. The method of claim 15, wherein the forming of the first photoresist pattern includes transferring a first pattern of a first photomask to the first photoresist pattern, and the forming of the second photoresist pattern includes transferring a second pattern of a second photomask to the second photoresist pattern.

17. The method of claim 16, wherein a width of each line of the second pattern is less than 30 micrometers (μm).

18. The method of claim 16, wherein the second pattern includes a grid, a cross, a polygon, a circle, a vertical line, a horizontal line or an oblique line.

19. The method of claim 16, wherein a beam diameter of the laser is between about 70 μm and about 100 μm.

20. The method of claim 19, wherein the beam diameter of the laser is greater than a pitch of the second conductive pattern.

\* \* \* \* \*